United States Patent
McDermott et al.

(10) Patent No.: US 7,267,727 B2
(45) Date of Patent: *Sep. 11, 2007

(54) PROCESSING OF SEMICONDUCTOR COMPONENTS WITH DENSE PROCESSING FLUIDS AND ULTRASONIC ENERGY

(75) Inventors: Wayne Thomas McDermott, Fogelsville, PA (US); Hoshang Subawalla, Macungie, PA (US); Andrew David Johnson, Doylestown, PA (US); Alexander Schwarz, Bethlehem, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/737,458

(22) Filed: Dec. 16, 2003

(65) Prior Publication Data

US 2004/0144399 A1    Jul. 29, 2004

Related U.S. Application Data

(63) Continuation-in-part of application No. 10/253,054, filed on Sep. 24, 2002, now abandoned.

(51) Int. Cl.
*B08B 7/04* (2006.01)
(52) U.S. Cl. .............................. 134/10; 134/1; 134/1.3; 134/11; 134/12; 134/31
(58) Field of Classification Search .................... 134/1, 134/1.3, 10, 11, 12, 31, 25.4
See application file for complete search history.

(56) References Cited

U.S. PATENT DOCUMENTS

| | | | |
|---|---|---|---|
| 4,944,837 A | 7/1990 | Nishikawa et al. |
| 4,992,308 A | 2/1991 | Sunol |
| 5,013,366 A | 5/1991 | Jackson et al. |
| 5,158,704 A | 10/1992 | Fulton et al. |
| 5,213,619 A | 5/1993 | Jackson et al. |

(Continued)

FOREIGN PATENT DOCUMENTS

EP    0726009 A2    8/1996

(Continued)

OTHER PUBLICATIONS

K. Jackson, et al., "Microemulsions in Supercritical Hydrochlorofluorocarbons," Langmuir 12(22), pp. 5289-5295 (1996).

(Continued)

*Primary Examiner*—M. Kornakov
(74) *Attorney, Agent, or Firm*—Lina Yang; Rosaleen Morris-Oskanian

(57) ABSTRACT

Method for processing an article with a dense processing fluid in a processing chamber while applying ultrasonic energy during processing. The dense fluid may be generated in a separate pressurization vessel and transferred to the processing chamber, or alternatively may be generated directly in the processing chamber. A processing agent may be added to the pressurization vessel, to the processing chamber, or to the dense fluid during transfer from the pressurization vessel to the processing chamber. The ultrasonic energy may be generated continuously at a constant frequency or at variable frequencies. Alternatively, the ultrasonic energy may be generated intermittently.

13 Claims, 6 Drawing Sheets

U.S. PATENT DOCUMENTS

| | | |
|---|---|---|
| 5,236,602 A | 8/1993 | Jackson |
| 5,266,205 A | 11/1993 | Fulton et al. |
| 5,339,844 A * | 8/1994 | Stanford et al. ............ 134/107 |
| 5,355,901 A | 10/1994 | Mielnik et al. |
| 5,370,740 A | 12/1994 | Chao et al. |
| 5,377,705 A | 1/1995 | Smith, Jr. et al. |
| 5,417,768 A | 5/1995 | Smith, Jr. et al. |
| 5,456,759 A * | 10/1995 | Stanford et al. ............... 134/1 |
| 5,494,526 A | 2/1996 | Paranjpe |
| 5,509,431 A | 4/1996 | Smith, Jr. et al. |
| 5,522,938 A | 6/1996 | O'Brien |
| 5,533,538 A | 7/1996 | Marshall |
| 5,733,964 A | 3/1998 | Johnston et al. |
| 5,783,082 A | 7/1998 | DeSimone et al. |
| 5,789,505 A | 8/1998 | Wilkinson et al. |
| 5,866,004 A | 2/1999 | Houck et al. |
| 5,866,005 A | 2/1999 | DeSimone et al. |
| 5,868,856 A | 2/1999 | Douglas et al. |
| 5,872,257 A | 2/1999 | Beckman et al. |
| 5,873,948 A | 2/1999 | Kim |
| 5,908,510 A | 6/1999 | McCullough et al. |
| 5,944,996 A | 8/1999 | DeSimone et al. |
| 5,976,264 A | 11/1999 | McCullough et al. |
| 6,024,801 A | 2/2000 | Wallace et al. |
| 6,092,538 A * | 7/2000 | Arai et al. .................... 134/1.3 |
| 6,113,708 A | 9/2000 | Hopple et al. |
| 6,176,895 B1 | 1/2001 | DeSimone et al. |
| 6,224,774 B1 | 5/2001 | DeSimone et al. |
| 6,228,563 B1 | 5/2001 | Starov et al. |
| 6,240,936 B1 | 6/2001 | DeSimone et al. |
| 6,242,165 B1 | 6/2001 | Vaartstra |
| 6,270,531 B1 | 8/2001 | DeYoung et al. |
| 6,277,753 B1 | 8/2001 | Mullee et al. |
| 6,286,231 B1 | 9/2001 | Bergman et al. |
| 6,297,206 B2 | 10/2001 | Romack et al. |
| 6,306,564 B1 | 10/2001 | Mullee |
| 6,331,487 B2 | 12/2001 | Koch |
| 6,333,268 B1 | 12/2001 | Starov et al. |
| 6,344,243 B1 | 2/2002 | McClain et al. |
| 6,357,142 B1 | 3/2002 | Bergman et al. |
| 6,403,544 B1 | 6/2002 | Davenhall et al. |
| 6,454,869 B1 | 9/2002 | Cotte et al. |
| 6,500,605 B1 | 12/2002 | Mullee et al. |
| 6,506,259 B1 | 1/2003 | Romack et al. |
| 6,602,349 B2 * | 8/2003 | Chandra et al. ............... 134/19 |
| 6,799,587 B2 * | 10/2004 | Marshall et al. ............... 134/60 |
| 2002/0026729 A1 | 3/2002 | Bergman et al. |
| 2002/0055323 A1 | 5/2002 | McClain et al. |
| 2002/0088477 A1 | 7/2002 | Cotte et al. |
| 2002/0112747 A1 | 8/2002 | DeYoung et al. |
| 2003/0003762 A1 | 1/2003 | Cotte et al. |

FOREIGN PATENT DOCUMENTS

| | | |
|---|---|---|
| EP | 0 836 895 A2 | 4/1998 |
| JP | 08-197021 | 8/1996 |
| WO | WO84/02291 | 6/1984 |
| WO | WO99/49996 | 10/1999 |
| WO | WO99/49998 | 10/1999 |
| WO | WO99/61177 | 12/1999 |
| WO | WO 00/16264 | 3/2000 |
| WO | WO 00/26421 | 5/2000 |
| WO | WO 01/21616 | 3/2001 |
| WO | WO 01/32323 A1 | 5/2001 |
| WO | WO 01/33613 A2 | 5/2001 |
| WO | WO 01/60534 A1 | 8/2001 |
| WO | WO 01/87505 | 11/2001 |
| WO | WO 02/11191 | 2/2002 |
| WO | WO 02/15251 A1 | 2/2002 |
| WO | WO 02/66176 | 8/2002 |
| WO | WO 2005/038898 A1 | 4/2005 |

OTHER PUBLICATIONS

J. Liu, et al., "Investigation of Nonionic Surfactant Dynol-604 Based Reverse Microemulsions Formed in Supercritical Carbon Dioxide," Langmuir 17, pp. 8040-8043 (2001).

H. J. Martinez, et al., "$SCCO_2$—Is it an Enabling Technology for the 90nm Node and Beyond?" International SeMatech slides (2002).

S. Pawat, "Novel Wafer Clean Technologies," International SeMatech slides (2001).

G. Weibel, "Supercritical $CO_2$ for Semiconductor Applications," Semiconductor Equipment and Materials International (2001).

J. Malloy, et al., "GC Analysis of Solvent Wash Samples," Air Products and Chemicals, Inc. (2003).

Carpenter, B.A. et al., Supercritical Fluid Extraction and Chromatography, *ACS Symposium Series 366*, Apr. 5-10, 1987, Denver, CO.

Devittori, C. et al., Article at http://mpi.powerultrasonics.com/cleaning-co2,html, "Multifrequency ultrasonic Actuators with Special Application to Ultrasonic Cleaning in Liquid and Supercritical CO2", 2001.

Enokida, Y. et al., "Ultrasound-Enhanced Dissolution of UO2 in Supercritical CO2 Containing a CO2-Philic Complexant of Tri-n-Butylphosphate and Nitric Acid", *Industrial & Engineering Chemistry Research*, (2002), 41 (9), pp. 2282-2286.

* cited by examiner

Scratched Silicon Wafer Before Exposure to Supercritical $CO_2$

Scratched Silicon Wafer After Exposure to Supercritical $CO_2$ and 20 KHz Ultrasonic Waves for 60 seconds

PROCESSING OF SEMICONDUCTOR COMPONENTS WITH DENSE PROCESSING FLUIDS AND ULTRASONIC ENERGY

CROSS-REFERENCE TO RELATED APPLICATIONS

This application is a continuation-in-part of U.S. patent application Ser. No. 10/253,054, filed 24 Sep. 2002, now abandoned the disclosure of which is incorporated herein by reference in its entirety.

BACKGROUND OF THE INVENTION

Small quantities of contamination are detrimental to the microchip fabrication process in the manufacturing of semiconductor electronic components. Contaminants may be introduced into the component from many sources such as residues from manufacturing process steps such as lithography, etching, stripping, and chemical mechanical planarization (CMP); particulates either indigenous to and/or resulting from manufacturing processes; inorganic particulates or materials such as native or chemical oxides, metal-containing compounds; or other sources. Contamination in the form of particulates, films, or molecules causes short circuits, open circuits, silicon crystal stacking faults, and other defects. These defects can cause the failure of finished microelectronic circuits, and such failures cause significant yield reductions, which greatly increases manufacturing costs.

Microelectronic circuit fabrication requires many processing steps. Processing is performed under extremely clean conditions and the amount of contamination needed to cause fatal defects in microcircuits is extremely small. For example, an individual particle as small as 0.01 micrometer in size can result in a killer defect in a modern microcircuit. Microcontamination may occur at any time during the many steps needed to complete the microcircuit. Therefore, periodic cleaning of the wafers used for microelectronic circuits is needed to maintain economical yields. Also, tight control of purity and cleanliness of the processing materials is required.

Numerous cleaning methods have been used in the manufacture of semiconductor electronic components. These include immersion in liquid cleaning agents to remove contamination through dissolution and chemical reaction. Such immersion may also serve to reduce the van der Waals adhesive forces and introduce double layer repulsion forces, thereby promoting the release of insoluble particles from substrates. A standard wet cleaning process in common use begins with exposure to a mixture of $H_2SO_4$, $H_2O_2$, and $H_2O$ at 110–130° C., and is followed by immersion in HF or dilute HF at 20–25° C. Next a mixture of $NH_4OH$, $H_2O_2$, and $H_2O$ at 60–80° C. removes particles, and a mixture of HCl, $H_2O_2$, and $H_2O$ at 60–80° C. removes metal contamination. Each of these steps is followed by a high purity $H_2O$ rinse. This wet cleaning process reaches fundamental barriers at dimensions less than 0.10 micrometer. As the device geometries shrink and gate oxide thickness decreases, sub-micrometer particle removal becomes increasingly difficult.

Stripping/removal of primarily organic photoresist may be performed using dilute aqueous mixtures containing $H_2SO_4$ and $H_2O_2$. Alternatively, the stripping/removal may be performed using a two-step plasma, or reactive ion etching process, followed by wet chemical cleaning of the residue material. Ozonated $H_2O$ has been used for the decomposition of hydrocarbon surface contaminants on silicon wafers.

Brush scrubbing has been used to enhance the liquid immersion process by introducing hydrodynamic shear forces to the contaminated surfaces. A typical application uses a wafer cleaning apparatus comprising two opposed brushes for brushing a vertically disposed wafer in a tank that can contain a process liquid.

The addition of ultrasonic energy can increase the effectiveness of the liquid immersion process. Sound waves vibrating at frequencies greater than 20,000 cycles per second (20 KHz), i.e., beyond the range of human hearing, have been used to transmit high frequency energy into liquid cleaning solutions.

Wet processing methods may become problematic as microelectronic circuit dimensions decrease and as environmental restrictions increase. Among the limitations of wet processing are the progressive contamination of re-circulated liquids, re-deposition from contaminated chemicals, special disposal requirements, environmental damage, special safety procedures during handling, reduced effectiveness in deeply patterned surfaces due to surface tension effects and image collapse (topography sensitivity), dependence of cleaning effectiveness on surface wet-ability to prevent re-adhesion of contaminants, and possible liquid residue causing adhesion of remaining particles. Aqueous cleaning agents that depend upon chemical reaction with surface contaminants may also present compatibility problems with new thin film materials, or with more corrosion-prone metals such as copper. In addition, the International Technology Roadmap for Semiconductors has recommended a 62% reduction in water use by the year 2005 and an 84% reduction by the year 2014 to prevent water shortages. With the continuing trend toward increasing wafer diameters having a larger precision surface area, larger volumes of liquid chemicals will be required in the fabrication process.

In view of these problems, methods for dry (anhydrous) surface cleaning of semiconductor electronic components are being developed. Among these are gas jet cleaning to remove relatively large particles from silicon wafers. However, gas jets can be ineffective for removing particles smaller than about 5 micrometers in diameter because the forces that hold particles on the surface are proportional to the particle size, while the aerodynamic drag forces generated by the flowing gas for removing the particles are proportional to the particle diameter squared. Therefore, the ratio of these forces tends to favor adhesion as the particle size shrinks. In addition, smaller particles are not exposed to strong drag forces in the jet since they normally lie within the surface boundary layer where the gas velocity is low.

Exposure to ozone combined with ultraviolet light can be used to decompose contaminating hydrocarbons from surfaces, but this technique has not been shown to remove inorganic contaminants or particles effectively.

Other alternatives to wet cleaning include the use of jets containing snow or pellet projectiles comprising frozen Ar, $N_2$, $H_2O$ or $CO_2$ which are used to "sandblast" contaminated surfaces. In these processes, pressurized gaseous or gas/liquid mixtures are expanded in a nozzle to a pressure near or below atmospheric pressure. The resulting Joule-Thomson cooling forms solid or liquid aerosol particles, which traverse the boundary layer and strike the contaminated surface. This technique requires extremely clean and pure processing materials. Trace molecular contaminants (e.g., hydrocarbons) in the feed gases can condense into solid particulates or droplets upon expansion, causing deposition of new contaminants on the surface. Although useful in providing removal of many surface contaminants, these processes cannot remove all of the important contaminants present on a wafer surface, and have not yet found wide acceptance in the semiconductor industry.

Immersion in supercritical fluids is another alternative to wet cleaning. The effectiveness of supercritical fluids in various cleaning and extraction applications is well established and extensively documented. Supercritical fluids have solvent power much greater than the corresponding gaseous state, and can effectively dissolve and remove unwanted films and molecular contaminants from a precision surface. The contaminants can be separated from the cleaning agent by a reduction in pressure below the critical value, which concentrates the contaminants for disposal and permits recovery and re-use of the cleaning fluid.

Supercritical $CO_2$ in particular has been used as a versatile and cost effective method to overcome the above-mentioned problems in wafer cleaning. Supercritical $CO_2$ effectively cleans parts with increasingly smaller dimensions and lowers water usage, thereby yielding improvements in performance and environmental benefits. Preliminary Cost of Ownership (CoO) studies have shown that supercritical $CO_2$ cleaning is also more cost effective when compared to aqueous cleaning. $CO_2$ in the supercritical state has particularly good solvent properties and has been found to be effective in removing organic impurities. It can be modified with added co-solvents or processing agents to widen the range of contaminants that can be removed, including particles, native or chemical oxides, metallic contaminants, and other inorganic materials. Ultrasonic energy can be introduced into supercritical fluid cleaning reactors to enhance the efficiency of the cleaning process.

Future microcircuits will have smaller feature sizes and greater complexities, and will require more processing steps in their fabrication. Contamination control in the process materials systems and processing environment will become even more critical. In view of these anticipated developments, there is a need for improved wafer cleaning methods to maintain or improve economical yields in the manufacture of these smaller and more complex microelectronic systems. In addition, the advent of smaller feature sizes and greater complexities will require improved fabrication processes steps including etching, thin film deposition, planarization, and photoresist development. Embodiments of the present invention, which are described below and defined by the following claims, address this need by improved processing methods utilizing dense processing fluids with the application of ultrasonic energy.

BRIEF SUMMARY OF THE INVENTION

A first embodiment of the invention includes a method for processing an substrate comprising:
(a) introducing the article into a sealable processing chamber and sealing the processing chamber;
(b) preparing a dense fluid by:
  (b1) introducing a subcritical fluid into a pressurization vessel and isolating the vessel; and
  (b2) heating the subcritical fluid at essentially constant volume and essentially constant density to yield a dense fluid;
(c) transferring at least a portion of the dense fluid from the pressurization vessel to the processing chamber, wherein the transfer of the dense fluid is driven by the difference between the pressure in the pressurization vessel and the pressure in the processing chamber, thereby pressurizing the processing chamber with transferred dense fluid;
(d) introducing one or more processing agents into the processing chamber either before (c), or during (c), or after (c) to provide a dense processing fluid;
(e) introducing ultrasonic energy into the processing chamber and contacting the article with the dense processing fluid to yield a spent dense processing fluid and a treated article; and
(f) separating the spent dense processing fluid from the treated article.

The dense fluid may be generated in (b2) at a reduced temperature in the pressurization vessel below about 1.8, wherein the reduced temperature is defined as the average absolute temperature of the dense fluid in the pressurization vessel after heating divided by the absolute critical temperature of the fluid. The contacting of the article with the dense processing fluid in the processing chamber in (d) may be effected at a reduced temperature in the processing chamber between about 0.8 and about 2.0, wherein the reduced temperature is defined as the average absolute temperature of the dense processing fluid in the processing chamber during (d) divided by the absolute critical temperature of the dense processing fluid.

The dense fluid may comprise one or more components selected from the group consisting of carbon dioxide, nitrogen, methane, oxygen, ozone, argon, hydrogen, helium, ammonia, nitrous oxide, hydrogen fluoride, hydrogen chloride, sulfur trioxide, sulfur hexafluoride, nitrogen trifluoride, monofluoromethane, difluoromethane, trifluoromethane, trifluoroethane, tetrafluoroethane, pentafluoroethane, perfluoropropane, pentafluoropropane, hexafluoroethane, hexafluoropropylene, hexafluorobutadiene, and octafluorocyclobutane, and tetrafluoromethane. The dense fluid may comprise one or more hydrocarbons having 2 to 6 carbon atoms.

The total concentration of the one or more processing agents in the dense processing fluid may range from about 0.1 to about 20 wt %. In one embodiment, the dense processing fluid may comprise one or more processing agents selected from the group consisting of a co-solvent, a surfactant, a chelating agent, and combinations thereof.

In another embodiment of the present invention, the dense fluid comprises one or more fluorinated dense fluids, such as, but not limited to, perfluorocarbon compounds, hydrofluorocarbon compounds, fluorinated nitriles, fluoroethers, fluoroamines, and other fluorinated compounds such as carbonyl fluoride ($COF_2$), nitrosyl fluoride (FNO), hexafluoropropylene oxide ($C_3F_6O_2$), hexafluorodisiloxane ($Si_2OF_6$), hexafluoro-1,3-dioxolane ($C_3F_6O_2$), hexafluoropropylene oxide ($C_3F_{60}$), fluoroxytrifluoromethane ($CF_4O$), bis(difluoroxy)methane ($CF_4O_2$), difluorodioxirane ($CF_2O_2$), and trifluoronitrosylmethane ($CF_3NO$). Further examples of fluorinated dense fluids include, but are not limited to, zeotropic and azeotropic mixtures of different refrigerants such as 507A 507A (mixture of pentafluoroethane and trifluoroethane) and 410A (mixture of difluoromethane and pentafluoroethane).

In yet another embodiment of this invention the dense processing fluid may comprise one or more processing agents selected from the group consisting of hydrogen fluoride, hydrogen chloride, chlorine trifluoride, and nitrogen trifluoride.

In yet another embodiment, the dense processing fluid may comprise one or more processing agents selected from the group consisting of organometallic precursors, photoresists, photoresist developers, interlayer dielectric materials, silane reagents, and stain-resistant coatings.

The pressure of the spent dense processing fluid may be reduced to yield at least a fluid phase and a residual compound phase, and the phases may be separated to yield a purified fluid and recovered residual compounds. The purified fluid may be recycled to provide a portion of the subcritical fluid in (b1). The pressure of the purified fluid may be reduced to yield a further-purified fluid phase and an additional residual compound phase, and the phases may be separated to yield a further-purified fluid and additional recovered residual compounds. The further-purified fluid may be recycled to provide a portion of the subcritical fluid in (b1).

The subcritical fluid in the pressurization vessel prior to heating in (b2) may comprise a vapor phase, a liquid phase, or coexisting vapor and liquid phases.

Another embodiment of the invention includes a method for processing an article comprising:
 (a) introducing the article into a sealable processing chamber and sealing the processing chamber;
 (b) preparing a dense processing fluid by:
   (b1) introducing a subcritical fluid into a pressurization vessel and isolating the vessel;
   (b2) heating the subcritical fluid at essentially constant volume and essentially constant density to yield a dense fluid; and
   (b3) introducing one or more processing agents into the pressurization vessel
     before introducing the subcritical fluid into the pressurization vessel, or
     after introducing the subcritical fluid into the pressurization vessel but before heating the pressurization vessel, or
     after introducing the subcritical fluid into the pressurization vessel and after heating the pressurization vessel;
 (c) transferring at least a portion of the dense processing fluid from the pressurization vessel to the processing chamber, wherein the transfer of the dense processing fluid is driven by the difference between the pressure in the pressurization vessel and the pressure in the processing chamber, thereby pressurizing the processing chamber with transferred dense processing fluid;
 (d) introducing ultrasonic energy into the processing chamber and contacting the article with the transferred dense processing fluid to yield a spent dense processing fluid and a treated article; and
 (e) separating the spent dense processing fluid from the treated article.

A further embodiment of the invention includes an apparatus for processing an article which comprises:
 (a) a fluid storage tank containing a subcritical fluid;
 (b) one or more pressurization vessels and piping means for transferring the subcritical fluid from the fluid storage tank to one or more pressurization vessels;
 (c) heating means to heat the contents of each of the one or more pressurization vessels at essentially constant volume and essentially constant density to convert the subcritical fluid into a dense fluid;
 (d) a sealable processing chamber for contacting an article with the dense fluid;
 (e) ultrasonic generation means for introducing ultrasonic energy into the sealable processing chamber;
 (f) piping means for transferring the dense fluid from the one or more pressurization vessels into the sealable processing chamber; and
 (g) one or more processing agent storage vessels and pumping means to inject one or more processing agents (1) into the one or more pressurization vessels or (2) into the piping means for transferring the dense fluid from the one or more pressurization vessels to the sealable processing chamber or (3) into the sealable processing chamber.

The apparatus may further comprise pressure reduction means and phase separation means to separate a spent dense processing fluid withdrawn from the processing chamber to yield at least a purified fluid and one or more recovered residual compounds. The apparatus may further comprise recycle means to recycle the purified fluid to the fluid storage tank.

Another embodiment of the invention relates to a method for processing an article comprising:
 (a) introducing the article into a sealable processing chamber and sealing the processing chamber;
 (b) providing a dense processing fluid in the processing chamber;
 (c) introducing ultrasonic energy into the processing chamber and varying the frequency of the ultrasonic energy while contacting the article with the dense processing fluid to yield a spent dense processing fluid and a treated article; and
 (e) separating the spent dense processing fluid from the treated article.

In certain embodiments, the frequency of the ultrasonic energy may be increased during (c). Alternatively, the frequency of the ultrasonic energy may be decreased during (c).

The dense processing fluid may be prepared by:
 (a) introducing a subcritical fluid into a pressurization vessel and isolating the vessel;
 (b) heating the subcritical fluid at essentially constant volume and essentially constant density to yield a dense fluid; and
 (c) providing the dense processing fluid by one or more steps selected from the group consisting of
   (1) introducing one or more processing agents into the dense fluid while transferring the dense fluid from the pressurization vessel to the processing chamber,
   (2) introducing one or more processing agents into the pressurization vessel to form a dense processing fluid and transferring the dense processing fluid from the pressurization vessel to the processing chamber,
   (3) introducing one or more processing agents into the dense fluid in the processing chamber after transferring the dense fluid from the pressurization vessel to the processing chamber,
   (4) introducing one or more processing agents into the pressurization vessel before introducing the subcritical fluid into the pressurization vessel,
   (5) introducing one or more processing agents into the pressurization vessel after introducing the subcritical fluid into the pressurization vessel but before heating the pressurization vessel, and
   (6) introducing one or more processing agents into the pressurization vessel after introducing the subcritical fluid into the pressurization vessel and after heating the pressurization vessel.

Alternatively, the dense processing fluid may be prepared by:
 (a) introducing a subcritical fluid into the sealable processing chamber and isolating the chamber;

(b) heating the subcritical fluid at essentially constant volume and essentially constant density to yield a dense fluid; and (c) providing the dense processing fluid by one or more steps selected from the group consisting of (1) introducing one or more processing agents into the sealable processing chamber before introducing the subcritical fluid into the sealable processing chamber, (2) introducing one or more processing agents into the sealable processing chamber after introducing the subcritical fluid into the sealable processing chamber but before heating the subcritical fluid therein, and (3) introducing one or more processing agents into the sealable processing chamber after introducing the subcritical fluid into the sealable processing chamber and after heating the subcritical fluid therein.

In an alternative embodiment of the invention, an article may be processed by a method comprising:

(a) introducing the article into a sealable processing chamber and sealing the processing chamber;

(b) providing a dense fluid in the processing chamber;

(c) introducing ultrasonic energy into the processing chamber and varying the frequency of the ultrasonic energy while contacting the article with the dense fluid to yield a spent dense fluid and a treated article; and (e) separating the spent dense fluid from the treated article.

Another embodiment of the invention may include a method for processing an article comprising:

(a) introducing the article into a sealable processing chamber and sealing the processing chamber;

(b) providing a dense processing fluid in the processing chamber;

(c) introducing ultrasonic energy into the processing chamber intermittently while contacting the article with the dense processing fluid to yield a spent dense processing fluid and a treated article; and (e) separating the spent dense processing fluid from the treated article.

In a further embodiment, a method for processing an article may comprise:

(a) introducing the article into a sealable processing chamber and sealing the processing chamber;

(b) providing a dense fluid in the processing chamber;

(c) introducing ultrasonic energy into the processing chamber intermittently while contacting the article with the dense fluid to yield a spent dense fluid and a treated article; and (e) separating the spent dense fluid from the treated article.

DETAILED DESCRIPTION OF THE INVENTION

Figure 1:
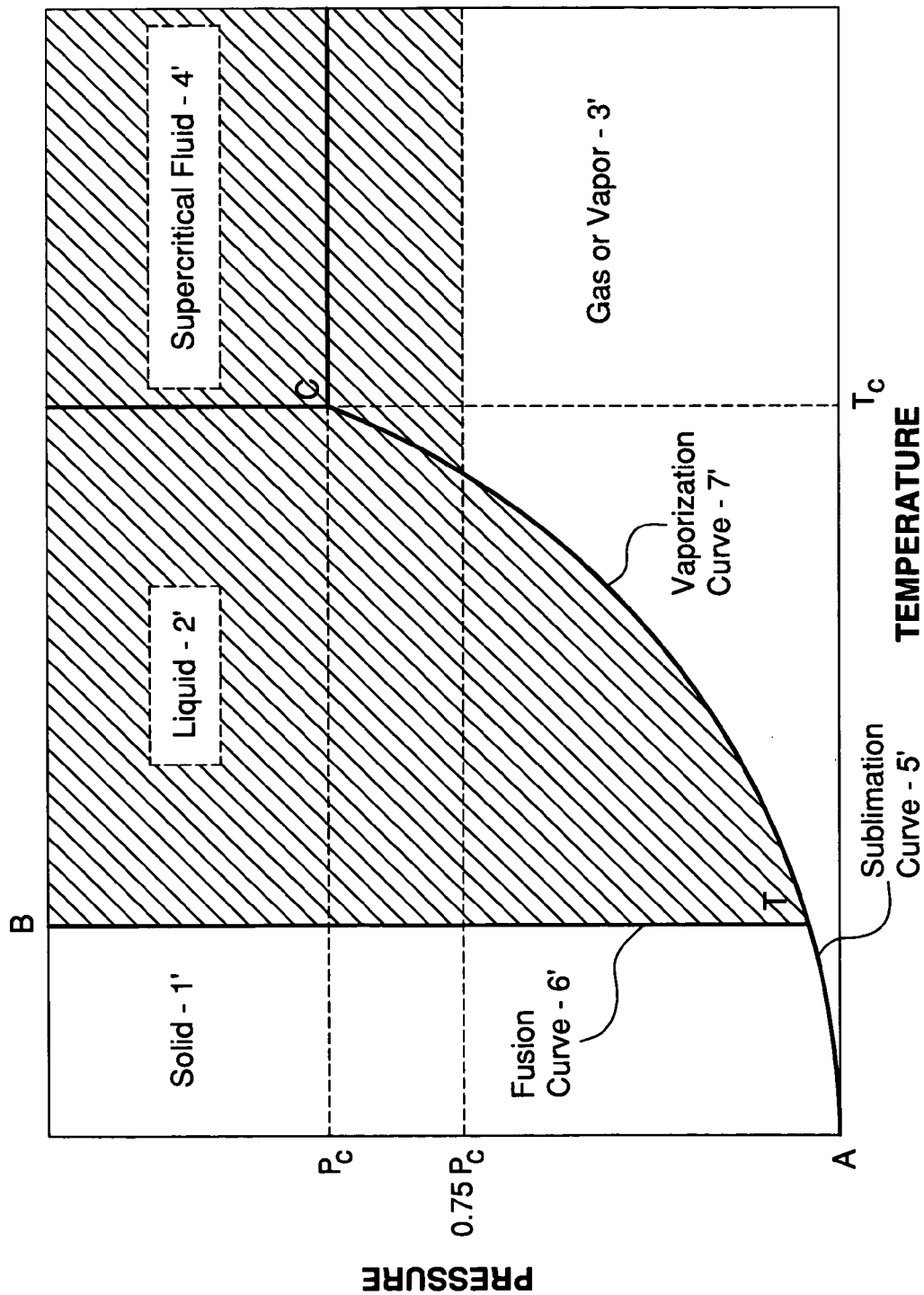
FIG. 1 is a pressure-temperature phase diagram for a single component supercritical fluid.

Cleaning is the most frequently repeated step in the manufacture of integrated circuits. At the 0.18-micrometer design rule, 80 of the approximately 400 total processing steps are cleaning steps. Wafers typically are cleaned after every contaminating process step and before each high temperature operation to ensure the quality of the circuit. Exemplary cleaning and removal applications include photoresist stripping/removal, particle/residue removal for post-chemical mechanical planarization (post-CMP cleaning), particle/residue removal for post-dielectric etching (or post-metal etching), and removal of metal contaminants.

A wide variety of contamination-sensitive articles encountered in the fabrication of microelectronic devices and micro-electromechanical devices can be cleaned or processed using embodiments of the present invention. The term "processing" or "processed" as used herein means contacting an article with a dense fluid or a dense processing fluid to effect physical and/or chemical changes to the article. The term "article" as used herein means any article of manufacture that can be contacted with a dense fluid or a dense processing fluid. Such articles may include, for example, silicon or gallium arsenide wafers, reticles, photomasks, flat panel displays, internal surfaces of processing chambers, printed circuit boards, surface mounted assemblies, electronic assemblies, sensitive wafer processing system components, electro-optical, laser and spacecraft hardware, surface micro-machined systems, and other related articles subject to contamination during fabrication.

Dense fluids are well-suited to convey processing agents to articles such as microelectronic components undergoing processing steps and for removing undesirable components from the microelectronic components upon completion of the process steps. These process steps typically are carried out batchwise and may include, for example, cleaning, extraction, film stripping, etching, deposition, drying, photoresist development, and planarization. Other uses for dense fluids include precipitation of nano-particles and suspension of metallic nano-crystals.

Dense fluids are ideal for these applications because these fluids characteristically have high solvent power, low viscosity, high diffusivity, and negligible surface tension relative to the articles being processed. As pointed out above, the processing fluids used in microelectronic processing must have extremely high purity, much higher than that of similar fluids used in other applications. The generation of extremely high purity dense fluids for these applications must be done with great care, preferably using the methods described herein.

In certain embodiments, the dense processing fluid may be used in a cleaning process. Typical contaminants to be removed from these articles in a cleaning process may include, for example, organic compounds such as exposed photoresist material, photoresist residue, UV- or X-ray-hardened photoresist, C—F-containing polymers, low and high molecular weight polymers, and other organic etch residues; inorganic compounds such as metal oxides, ceramic particles from CMP slurries and other inorganic etch residues; metal containing compounds such as organometallic residues and metal organic compounds; ionic and neutral, light and heavy inorganic (metal) species, moisture, and insoluble materials, including particles generated by planarization and sputter etch processes.

FIG. 1 is a pressure-temperature phase diagram for a single component supercritical fluid. The term "component" as used herein means an element (for example, hydrogen, helium, oxygen, nitrogen) or a compound (for example, carbon dioxide, methane, nitrous oxide, sulfur hexafluoride). Referring to FIG. 1, four distinct regions or phases, solid 1', liquid 2', gas 3' and supercritical fluid 4', exist for a single component. The critical point, designated "C" in FIG. 1, is defined as that pressure (critical pressure $P_c$) and temperature (critical temperature $T_c$) below which a single component can exist in vapor/liquid equilibrium. The density of the single component at the critical point is its critical density. Also shown in FIG. 1 are the sublimation curve 5', or the line between "A" and 'T' which separates the solid 1' and gas 3' regions, the fusion curve 6', or the line between "T" and "B" which separates the liquid 2' and solid 1' regions, and the vaporization curve 7', or the line between 'T' and "C" which separates the liquid 2' and gas 3' regions. The three curves meet at the triple point, designated "T", wherein the three phases, or solid, liquid and gas, coexist in equilibrium. A phase is generally considered a liquid if it can be vaporized by reducing pressure at constant temperature. Similarly, a phase is considered a gas if it can be condensed by reducing the temperature at a constant pressure. The gas and liquid regions become indistinguishable at or above the critical point C, as shown in FIG. 1.

A single-component supercritical fluid is defined as a fluid at or above its critical temperature and pressure. A related single-component fluid having similar properties to the single-component supercritical fluid is a single-phase fluid which exists at a temperature below its critical temperature and a pressure above its liquid saturation pressure. An additional example of a single-component dense fluid may be a single-phase fluid at a pressure above its critical pressure or a pressure above its liquid saturation pressure. A single-component subcritical fluid is defined as a fluid at a temperature below its critical temperature or a pressure below its critical pressure or alternatively a pressure P in the range $0.75P_c \leq P \leq P_c$ and a temperature above its vapor saturation temperature. In the present disclosure, the term "dense fluid" as applied to a single-component fluid is defined to include a supercritical fluid, a single-phase fluid which exists at a temperature below its critical temperature and a pressure above its liquid saturation pressure, a single-phase fluid at a pressure above its critical pressure or a pressure above its liquid saturation pressure, and a single-component subcritical fluid. An example of a single component dense fluid is shown as the thatched region in FIG. 1.

A dense fluid alternatively may comprise a mixture of two or more components. A multi-component dense fluid differs from a single-component dense fluid in that the liquid saturation pressure, critical pressure, and critical temperature are functions of composition. In this case, the dense fluid is defined as a single-phase multi-component fluid of a given composition which is above its saturation or bubble point pressure, or which has a combination of pressure and temperature above the mixture critical point. The critical point for a multi-component fluid is defined as the combination of pressure and temperature above which the fluid of a given composition exists only as a single phase. In the present disclosure, the term "dense fluid" as applied to a multi-component fluid is defined to include both a supercritical fluid and a single-phase fluid that exists at a temperature below its critical temperature and a pressure above its bubble point or saturation pressure. A multi-component dense fluid also can be defined as a single-phase multi-component fluid at a pressure above its critical pressure or a pressure above its bubble point or liquid saturation pressure. A multi-component dense fluid can also be defined as a single-phase or multi-phase multi-component fluid at a pressure P in the range $0.75P_c \leq P \leq P_c$, and a temperature above its bubble point or liquid saturation temperature. A multi-component subcritical fluid is defined as a multi-component fluid of a given composition which has a combination of pressure and temperature below the mixture critical point.

The generic definition of a dense fluid thus includes a single component dense fluid as defined above as well as a multi-component dense fluid as defined above. Similarly, a subcritical fluid may be a single-component fluid or a multi-component fluid. In some embodiments, a single-component subcritical fluid or a multi-component subcritical fluid may be a dense fluid.

Figure 2:
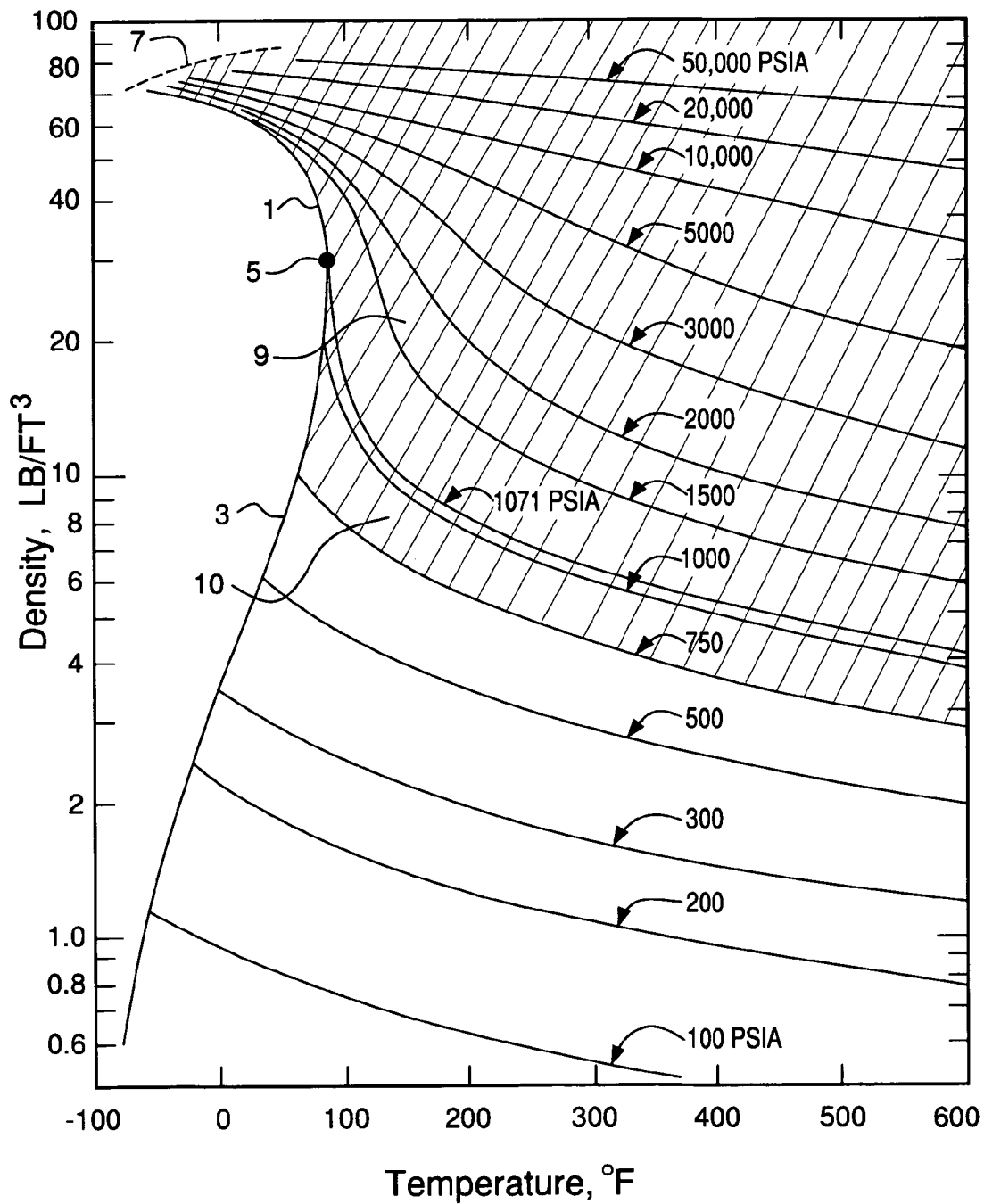
FIG. 2 is a density-temperature phase diagram for carbon dioxide.

An example of a dense fluid for a single component is illustrated in FIG. 2, which is a representative density-temperature phase diagram for carbon dioxide. This diagram shows saturated liquid curve 1 and saturated vapor curve 3, which merge at critical point 5 at the critical temperature of 87.9° F. and critical pressure of 1,071 psia. Lines of constant pressure (isobars) are shown, including the critical isobar of 1,071 psia. Line 7 is the melting curve. The region to the left of and enclosed by saturated liquid curve 1 and saturated vapor curve 3 is a two-phase vapor-liquid region. The region outside and to the right of liquid curve 1, saturated vapor curve 3, and melting curve 7 is a single-phase fluid region. The dense fluid as defined herein is indicated by cross-hatched regions 9 (at or above critical pressure) and 10 (below critical pressure).

Figure 3:
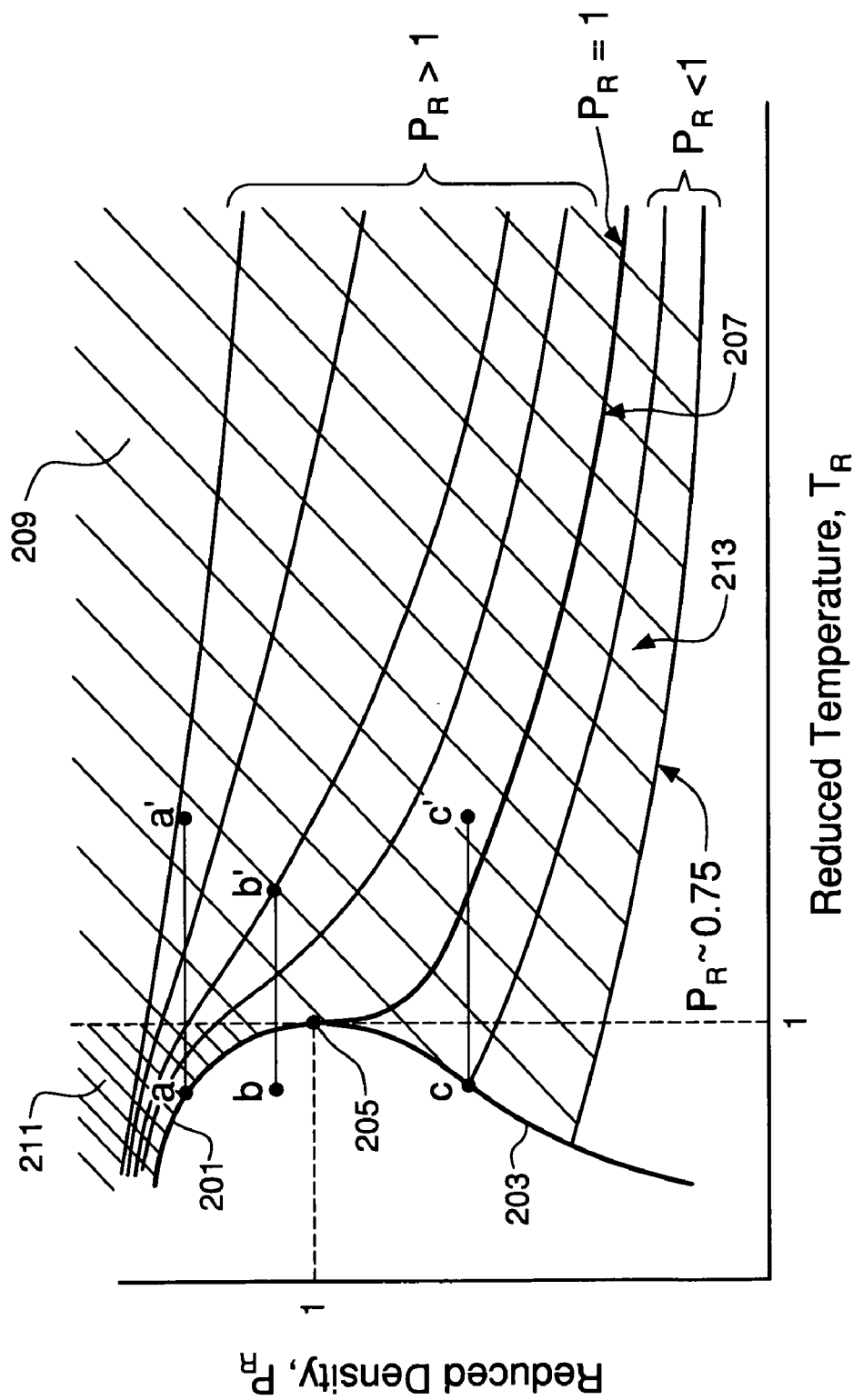
FIG. 3 is a generalized density-temperature phase diagram.

A generic density-temperature diagram can be defined in terms of reduced temperature, reduced pressure, and reduced density as shown in FIG. 3. The reduced temperature ($T_R$) is defined as the absolute temperature divided by the absolute critical temperature, reduced pressure ($P_R$) is defined as the absolute pressure divided by the absolute critical pressure, and reduced density ($\rho_R$) is defined as the density divided by the critical density. The reduced temperature, reduced pressure, and reduced density are all equal to 1 at the critical point by definition. FIG. 3 shows analogous features to FIG. 2 including saturated liquid curve 201 and saturated vapor curve 203, which merge at critical point 205 at a reduced temperature of 1, a reduced density of 1, and a reduced pressure of 1. Lines of constant pressure (isobars) are shown, including critical isobar 207 for which $P_R=1$. In FIG. 3, the region to the left of and enclosed by saturated liquid curve 201 and saturated vapor curve 203 is the two-phase vapor-liquid region. The crosshatched region 209 above the $P_R=1$ isobar and to the right of the critical temperature $T_R=1$ is a single-phase supercritical fluid region. The crosshatched region 211 above saturated liquid curve 201 and to the left of the critical temperature $T_R=1$ is a single-phase compressed liquid region. The cross-thatched region 213 to the right of saturated vapor curve 203, and below the isobar $P_R=1$ represents a single-phase compressed or dense gas. The dense fluid as defined herein includes both single-phase supercritical fluid region 209, single-phase compressed liquid region 211, and the single-phase dense gas region 213.

The generation of a dense fluid in embodiments of the present invention may be illustrated using FIG. 3. In one embodiment, a saturated liquid at point a is introduced into a vessel and sealed therein. The sealed vessel is heated isochorically, i.e., at essentially constant volume, and isopycnically, i.e., at essentially constant density. The fluid moves along the line as shown to point a' to form a supercritical fluid in region 209. This is generically a dense fluid as defined above. Alternatively, the fluid at point a may be heated to a temperature below the critical temperature ($T_R=1$) to form a compressed liquid. This also is a generic dense fluid as defined above. In another embodiment, a two-phase vapor liquid mixture at point b is introduced into a vessel and sealed therein. The sealed vessel is heated isochorically, i.e., at essentially constant volume, and isopycnically, i.e., at essentially constant density. The fluid moves along the line as shown to point b' to form a supercritical fluid in region 209. This is generically a dense fluid as defined above. In another embodiment, a saturated vapor at point c is introduced into a vessel and sealed therein. The sealed vessel is heated isochorically, i.e., at essentially constant volume, and isopycnically, i.e., at essentially constant density. The fluid moves along the line as shown to point c' to form a supercritical fluid in region 209. This is generically a dense fluid as defined above. In yet another embodiment an unsaturated vapor at point d is introduced into a vessel and sealed therein. The sealed vessel is heated isochorically, i.e., at essentially constant volume, and isopycnically, i.e., at essentially constant density. The fluid moves along the line as shown to point d' to form a dense gas in region 213. This is generically a dense fluid as defined above.

The final density of the dense fluid is determined by the volume of the vessel and the relative amounts of vapor and liquid originally introduced into the vessel. A wide range of densities thus is achievable by this method. The terms "essentially constant volume" and "essentially constant density" mean that the density and volume are constant except for negligibly small changes to the volume of the vessel that may occur when the vessel is heated.

Depending upon the application, the dense fluid may be either a single-component fluid or a multi-component fluid, and may have a reduced temperature ranging from about 0.2 to about 2.0, and a reduced pressure above 0.75. The reduced temperature is defined here as the absolute temperature of the fluid divided by the absolute critical temperature of the fluid, and the reduced pressure is defined here as the absolute pressure divided by the absolute critical pressure.

The dense fluid may comprise, but is not limited to, one or more components selected from the group consisting of carbon dioxide, nitrogen, methane, oxygen, ozone, argon, hydrogen, helium, ammonia, nitrous oxide, hydrocarbons having 2 to 6 carbon atoms, hydrogen fluoride, hydrogen chloride, sulfur trioxide, sulfur hexafluoride, chlorine trifluoride, hexafluoropropylene, hexafluorobutadiene, octafluorocyclobutane and tetrafluorochloroethane.

In certain embodiments of the present invention, the dense fluid comprises one or more fluorinated dense fluids, such as, but not limited to, perfluorocarbon compounds (e.g., tetrafluoromethane ($CF_4$) and hexafluoroethane ($C_2F_6$)), hydrofluorocarbons (e.g., difluoromethane ($CH_2F_2$), trifluoromethane ($CHF_3$), methyl fluoride ($CH_3F$), pentafluoroethane ($C_2HF_5$), trifluoroethane ($CF_3CH_3$), difluoroethane ($CHF_2CH_3$), and ethyl fluoride ($C_2H_5F$)), fluorinated nitriles (e.g., perfluoroacetonitrile ($C_2F_3N$) and perfluoropropionitrile ($C_3F_5N$)), fluoroethers (e.g., perfluorodimethylether ($CF_3$—O—$CF_3$), pentafluorodimethyl ether ($CF_3$—O—$CHF_2$), trifluoro-dimethyl ether ($CF_3$—O—$CH_3$), difluoro-dimethyl ether ($CF_2H$—O—$CH_3$), and perfluoromethyl vinyl ether ($CF_2$=$CFO$—$CF_3$)), fluoroamines (e.g., perfluoromethylamine ($CF_5N$)), and other fluorinated compounds (e.g., nitrogen trifluoride ($NF_3$), carbonyl fluoride ($COF_2$), nitrosyl fluoride (FNO), hexafluoropropylene oxide ($C_3F_6O_2$), hexafluorodisiloxane ($Si_2OF_6$), hexafluoro-1,3-dioxolane ($C_3F_6O_2$), hexafluoropropylene oxide ($C_3F_6O$), fluoroxytrifluoromethane ($CF_4O$), bis(difluoroxy)methane ($CF_4O_2$), difluorodioxirane ($CF_2O_2$), and trifluoronitrosylmethane ($CF_3NO$)). Further examples of fluorinated dense fluids include, but are not limited to, zeotropic and azeotropic mixtures of different refrigerants such as 507A 507A (mixture of pentafluoroethane and trifluoroethane) and 410A (mixture of difluoromethane and pentafluoroethane). The normal boiling point temperatures ($T_b$), critical temperatures and pressures of some exemplary fluorinated dense fluids are provided in Table I. In these embodiments, fluorinated dense fluids with a low critical temperature ($T_c$) and critical pressure ($P_c$) are preferable.

TABLE I

Thermodynamic Properties of Select Fluorinated Solvents

| Solvent/Gas | Formula | $T_b$ (° C.) | $T_c$ (° C.) | $P_c$ (bar) |
|---|---|---|---|---|
| Nitrogen trifluoride | $NF_3$ | −129.1 | −39.0 | 45.3 |
| Tetrafluoromethane | $CF_4$ | −127.9 | −45.4 | 37.4 |
| Trifluoromethane | $CHF_3$ | −82.1 | 26.3 | 48.6 |
| Hexafluoroethane | $C_2F_6$ | −78.2 | 20.0 | 30.6 |
| Pentafluoroethane | $C_2HF_5$ | −48.6 | 66.3 | 36.3 |
| Difluoromethane | $CH_2F_2$ | −51.8 | 78.6 | 58.3 |
| Methyl Fluoride | $CH_3F$ | −78.4 | 42.0 | 56.0 |
| Trifluoroethane | $C_2F_3H_3$ | −47.2 | 72.7 | 37.6 |
| Refrigerant 507A | Mixture | −47.0 | 70.7 | 37.1 |
| Perfluoroethylene | $C_2F_4$ | −76.0 | 33.3 | 39.4 |
| Perfluoropropylene | $C_3F_6$ | −29.6 | 86.2 | 29.0 |
| Difluoroethylene | $CF_2$=$CH_2$ | −84.0 | 30.0 | 44.6 |
| Perfluoroacetonitrile | $C_2F_3N$ | −64.5 | 38.0 | 36.2 |

A dense processing fluid is defined as a dense fluid to which one or more processing agents have been added. The dense processing fluid may be used in processing such as film stripping, cleaning, drying, etching, planarization, deposition, extraction, photoresist development, or formation of suspended nano-particles and nano-crystals. A processing agent is defined as a compound or combination of compounds that promotes physical and/or chemical changes to an article or substrate in contact with the dense processing fluid. It can also enhance the cleaning ability of the dense processing fluid to remove contaminants from a contaminated substrate Further, the processing agent may solubilize and/or disperse the contaminant within the dense cleaning fluid. The total concentration of these processing agents in the dense processing fluid typically is less that about 50 wt %, or may range from about 0.1 to about 20 wt %. The dense processing fluid typically remains a single phase after a processing agent is added to a dense fluid. Alternatively, the dense processing fluid may be an emulsion or suspension containing a second suspended or dispersed phase containing the processing agent.

Processing agents may include, for example, film strippers, cleaning or drying agents, entrainers, etching or planarization reactants, photoresist developers, and deposition materials or reactants. Processing agents may further include cosolvents, surfactants, chelating agents, chemical modifiers, and other additives. Some examples of representative processing agents are acetylenic alcohols and derivatives thereof, acetylenic diols (non-ionic alkoxylated and/or self-emulsifiable acetylenic diol surfactants) and derivatives thereof, alcohols, quaternary amines and di-amines, amides (including aprotic solvents such as dimethyl formamide and dimethyl acetamide), alkyl alkanolamines (such as dimethanolethylamine), and chelating agents such as beta-diketones, beta-ketoimines, carboxylic acids, mallic acid and tartaric acid based esters and diesters and derivatives thereof, and tertiary amines, diamines and triamines. In certain embodiments of the present invention, the processing agent may include a derivatized acetylenic alcohol or acetylenic diol, a derivatized malid acid or tartaric acid diester, and/or any of the other compounds disclosed in U.S. patent application Ser. No. 10/737,203 which is incorporated herein by reference in its entirety.

comprises from 0.1 to 95 weight percent of a dense fluid such as liquid/supercriticial $CO_2$, from 5 to 99.9 weight percent of a fluorinated dense fluid, from 0 to 40 weight percent of a co-solvent such as a nitrile compound, and from 0 to 40 of at least one processing agent.

The specific composition of the dense processing fluid depends on the application. Exemplary formulations for various substrate treatment applications are provided in Table II.

TABLE II

Exemplary Formulations for Various Substrate Treatment Applications

| Application | Exemplary Residues or Contaminants | Dense Fluid | Acetylenic Alcohol or Acetylenic Diol | Cosolvent | Chelating Agent |
|---|---|---|---|---|---|
| Post-etch cleaning (metals) | Fluoropolymers, organometallic species, metal particles | Liquid or Supercritical $CO_2$ Supercritical $C_2F_6$ | Surfynol ® 61, Surfynol ® 420, Dynol ® 604 Hydrogenated Surfynol ® 104 | Tertiary ammonium hydroxides(TMAH, TBAH), Alkanolamines, Nitriles | Dibutyl malate Dipentyl tartrate Diisoamyl tartrate |
| Post-etch cleaning (polymers) | Fluoropolymers, hardened organic polymer | Liquid or Supercritical $CO_2$, Supercritical $C_2F_6$ | Surfynol ® 61, Surfynol ® 420, Dynol ® 604, Hydrogenated Surfynol ® 104 | TMAH, TBAH, Alkanolamines, Nitriles, Tertiary amines | |
| Post-CMP cleaning | Metal particles and ions, organic and inorganic solvent residues | Liquid or Supercritical $CO_2$ | Surfynol ® 61, Surfynol ® 2502 Surfynol ® 420 Hydrogenated Surfynol ® 104 | TMAH, TBAH, Alkanolamines, Tertiary amines | Dibutyl malate, Dipentyl tartrate, Diisoamyl tartrate, Carboxylic acids |
| Photoresist removal/stripping | Organic polymer residue, fluoropolymers | Liquid or Supercritical $CO_2$ | Surfynol ® 61, Surfynol ® 420, Dynol ® 604, Hydrogenated Surfynol ® 104 | Nitriles, Tertiary amines, Acetophenone, Alkanolamines | |
| Ash residue removal | Oxidized carbon residue, organic polymer or fluoropolymer residue, oxidized metallic residue | Liquid or Supercritical $CO_2$ | Surfynol ® 61, Surfynol ® 420, Dynol ® 604, Hydrogenated Surfynol ® 104 | Alkanolamines, Tertiary amines, Nitriles | Dibutyl malate, Dipentyl tartrate, Diisoamyl tartrate, Carboxylic acids |

In formulations wherein a cosolvent and a chelating agent is added to the dense processing fluid, the composition of the dense processing fluid comprises from 50 to 99 weight percent of dense fluid, from 1 to 20 weight present of a cosolvent, from 1 to 10 weight percent of at least one acetylenic diol or acetylenic alcohol, and from 0.1 to 10 weight percent of a chelating agent. In one particular embodiment, the dense processing fluid comprises from 65 to 99 weight percent of a dense fluid such as liquid/supercriticial $CO_2$, from 1 to 20 weight percent of a co-solvent such as a nitrile compound, from 1 to 10 weight percent at least one acetylenic alcohol or acetylenic diol, and from 0.1 to 5 weight percent of a chelating agent. In another embodiment the dense processing fluid comprises from 0.1 to 99 wt % of a dense fluid such as liquid/supercritical $CO_2$, from 5 to 90.0 wt % of a fluorinated dense fluid (e.g. supercritical hexafluoroethane), from 0 to 10 wt % of at least one acetylenic alcohol and/or acetylenic diol, from 0 to 20 wt % of a co-solvent, and from 0 to 5 wt % of a chelating agent. In yet another embodiment, the dense processing fluid In one embodiment of the present invention, the dense processing fluid may be made using the method and/or apparatus provided in U.S. patent application Ser. No. 10/253,296 which was filed on Sep. 24, 2002. In this embodiment, additives such as at least one processing agent and/or cosolvent, may be added to the dense fluid, which optionally contains at least one fluorinated dense fluid, either before, during, and/or after transferring the dense fluid from the pressurization vessel to the processing chamber. Alternatively, additives such as at least one processing agent and/or cosolvent, may be added to the subcritical fluid, which optionally contains at least one fluorinated dense fluid, in the pressurization vessel before, during, and/or after heating the pressurization vessel to transform the subcritical fluid to the dense fluid.

Figure 4:
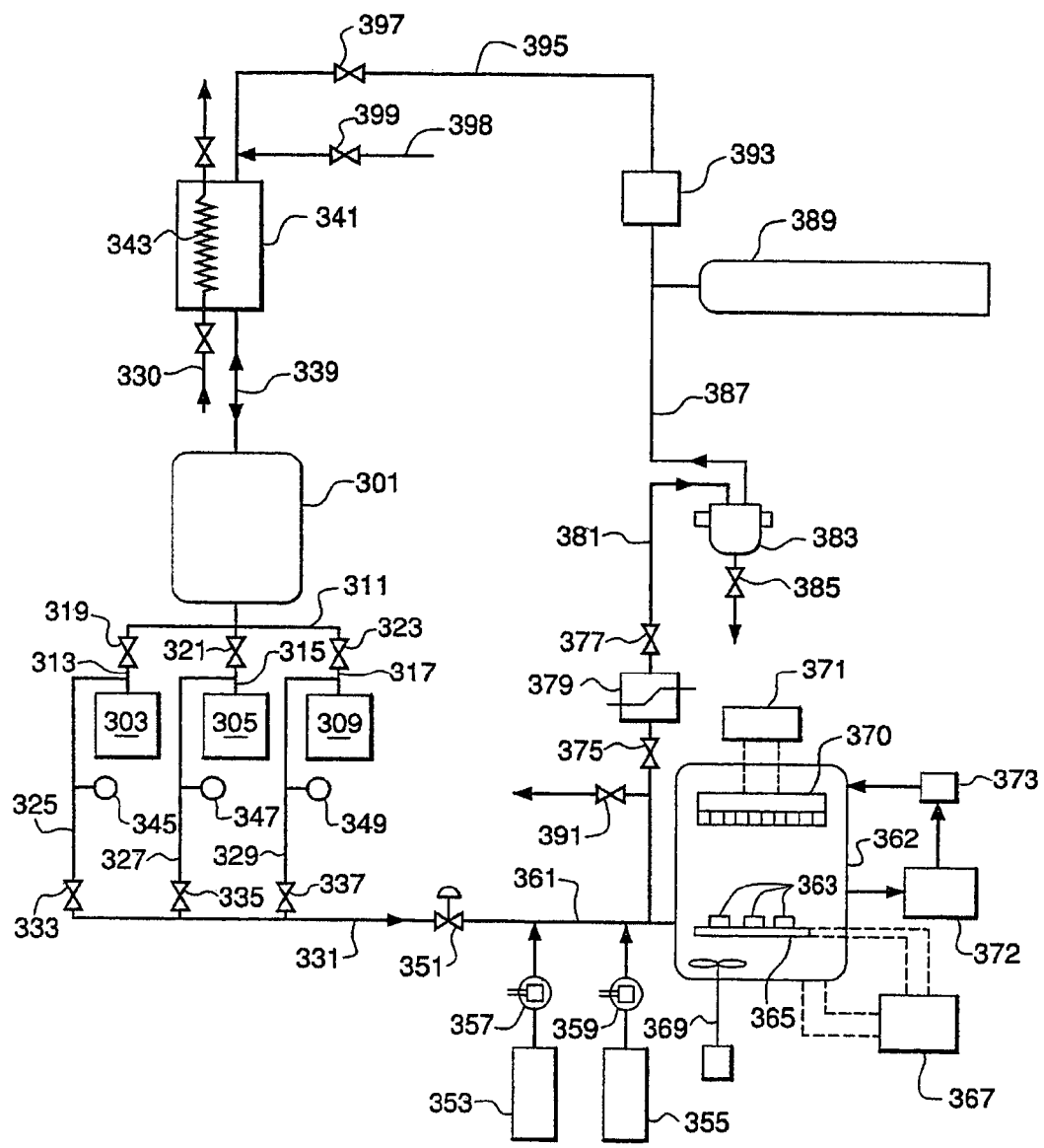
FIG. 4 is a process flow diagram illustrating an embodiment of the invention.

An embodiment of the invention can be illustrated by the generation and use of a dense processing fluid for use in the cleaning or processing of an substrate such as a microelectronic component. An exemplary process for this embodiment is shown in FIG. 4, which illustrates an isochoric (constant volume) carbon dioxide pressurization system to generate a carbon dioxide dense fluid for an ultrasonic electronic component cleaning chamber or processing tool, and includes a carbon dioxide recovery system to recycle carbon dioxide after separation of extracted contaminants. Liquid carbon dioxide and its equilibrium vapor are stored in carbon dioxide supply vessel 301, typically at ambient temperature; at 70° F., for example, the vapor pressure of carbon dioxide is 854 psia. At least one carbon dioxide pressurization vessel is located downstream of the supply vessel 301. In this embodiment, three pressurization vessels 303, 305, and 309 (described in more detail below) are shown in flow communication with carbon dioxide supply vessel 301 via manifold 311 and lines 313, 315, and 317 respectively. These lines are fitted with valves 319, 321, and 323, respectively, to control flow of carbon dioxide from supply vessel 301 to the pressurization vessels. Fluid supply lines 325, 327, and 329 are connected to manifold 331 via valves 333, 335, and 337 respectively.

Figure 5:
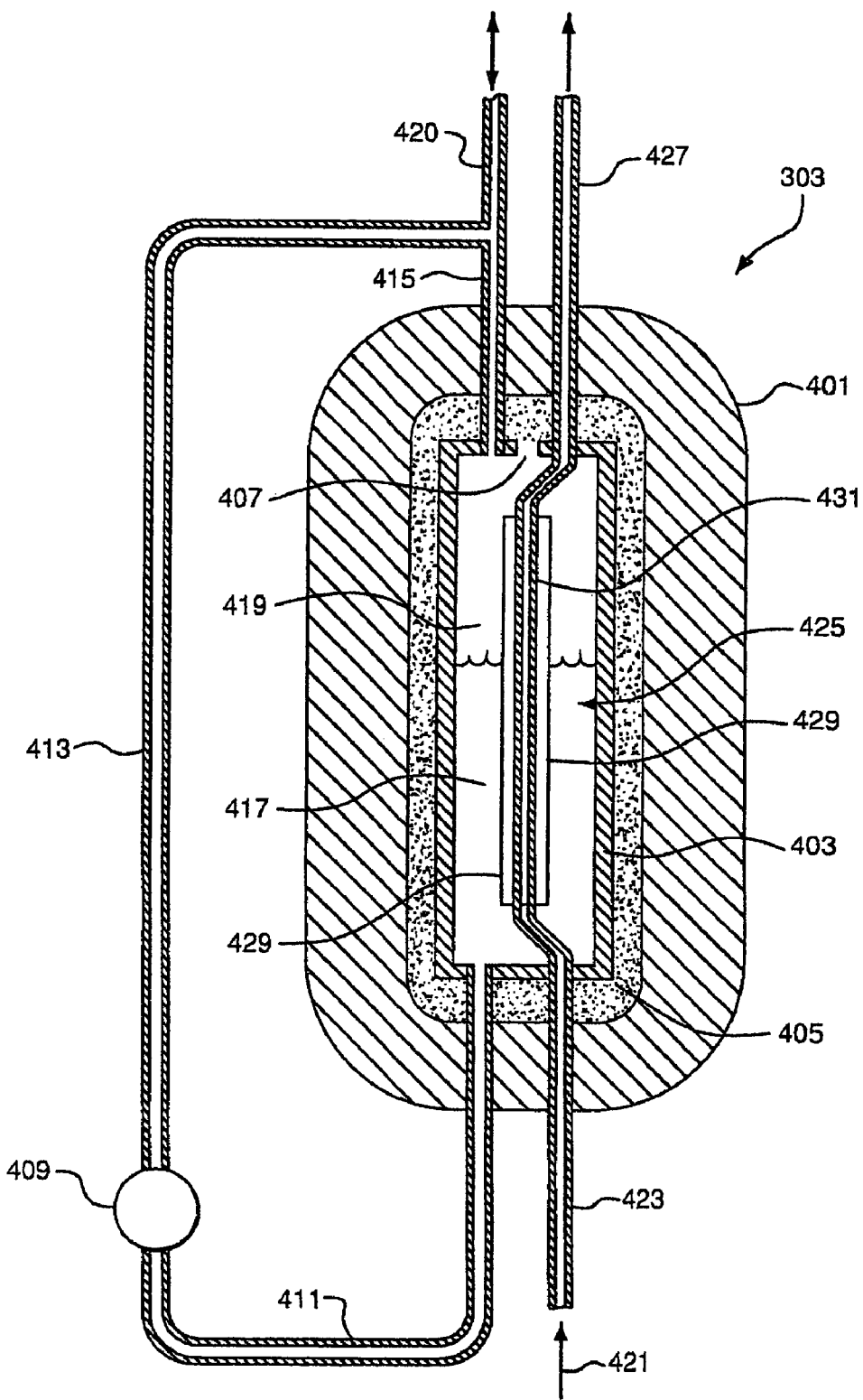
FIG. 5 is a schematic drawing of a pressurization vessel used in the embodiment of FIG. 4.

A detailed illustration of pressurization vessel 303 is given in FIG. 5. Pressurization vessel 303 comprises outer pressure casing 401, inner vessel 403, and thermal insulation 405 between the inner vessel and the outer pressure casing. The thermal mass of inner vessel 403 is preferably minimized to minimize the cool-down time when the vessel is initially filled from carbon dioxide supply vessel 301. Inner vessel 403 is in fluid communication with thermal insulation 405 via opening 407 to ensure that the pressures inside and outside of inner vessel 403 are approximately equal, which allows the wall thickness and thermal mass of inner vessel 403 to be minimized. Opening 407 may contain a de-misting medium, such as metal mesh or porous sintered metal (not shown), to prevent liquid carbon dioxide droplets from migrating into thermal insulation 405.

The level of liquid in the pressurization vessel may be monitored conveniently by differential pressure sensor 409, which is in fluid communication with the interior of inner vessel 403 via lines 411, 413, and 415. A typical liquid level is shown between liquid 417 and vapor 419 in inner vessel 403. Inner vessel 403 is in fluid communication with lines 313 and 325 of FIG. 4 via line 420.

Heat may be supplied to inner vessel 403 by any desired method. In one embodiment, hot heating fluid 421 is supplied via line 423 to heat exchanger 425, which heats liquid 417 and vapor 419 by indirect heat exchange. Cooled heating fluid is withdrawn via line 427. Heat exchanger 425 can be any type of heat exchange assembly. One type of useful heat exchange assembly is a longitudinally-finned pipe as shown in which a plurality of fins 429 are brazed or welded to pipe 431. The temperature and flow rate of heating fluid 421 may be regulated to control the heating rate during pressurization and the final temperature and pressure of the dense fluid formed within inner vessel 403.

Returning now to FIG. 4, carbon dioxide supply vessel 301 is connected via two-way flow line 339 to carbon dioxide liquefier 341 located above the carbon dioxide supply vessel 301. Heat exchanger 343, which may be a plate and fin or other type of heat exchanger such as heat exchanger 425 of FIG. 5, is used to cool the interior of liquefier 341. A cooling fluid is supplied via line 330 and may be, for example, cooling water at an ambient temperature of 70° F., which will maintain the pressure in carbon dioxide supply vessel 301 at the corresponding carbon dioxide vapor pressure of 854 psia.

In this illustration, valve 319 is open while valves 321, 323, and 333 are closed. Valve 335 or 337 may be open to supply dense fluid carbon dioxide to manifold 331 from pressurization vessel 305 or 309, which previously may have been charged with carbon dioxide and pressurized as described below. Liquid carbon dioxide from supply vessel 301 flows downward into pressurization vessel 303 via manifold 311, valve 319, and line 313. As the liquid carbon dioxide enters pressurization vessel 303, which was warmed in a previous cycle, initial liquid flashing will occur. Warm flash vapor returns upward into the carbon dioxide supply vessel 301 via line 313 and manifold 311 as liquid flows downward into pressurization vessel 303. The warm flash vapor flows back into carbon dioxide supply vessel 301 and increases the pressure therein. Excess vapor flows from supply vessel 301 via line 339 to carbon dioxide liquefier 341, wherein the vapor is cooled and condensed to flow downward via line 339 back to supply vessel 301.

After initial cooling and pressurization, liquid carbon dioxide flows from supply vessel 301 into pressurization vessel 303. When the pressurization vessel is charged with liquid carbon dioxide to a desired depth, valve 319 is closed to isolate the vessel. The carbon dioxide isolated in vessel 303 is heated by indirect heat transfer as described above and is pressurized as temperature increases. The pressure is monitored by pressure sensor 345 (pressure sensors 347 and 349 are used similarly for vessels 305 and 309 respectively). As heat is transferred to the carbon dioxide in vessel 303, the temperature and pressure rise, the separate liquid and vapor phases become a single phase, and a dense fluid is formed. This dense fluid may be heated further to become a supercritical fluid, which may be a fluid at a temperature above its critical temperature and a pressure above its critical pressure. Conversely, the subcritical fluid may be a fluid at a temperature below its critical temperature or a pressure below its critical pressure. The carbon dioxide charged to pressurization vessel 303 prior to heating is a subcritical fluid. This subcritical fluid may be, for example, a saturated vapor, a saturated liquid, or a two-phase fluid having coexisting vapor and liquid phases.

As additional heat is transferred, the temperature and pressure quickly rise to supercritical levels to form a supercritical fluid having a desired density. The final carbon dioxide pressure in the pressurization vessel of a known volume can be predicted from the volume of the initial liquid charge. For example, at 854 psia and 70° F. the density of liquid carbon dioxide in the vessel is 47.6 lb/ft$^3$ and the density of the coexisting carbon dioxide vapor is 13.3 lb/ft$^3$. If the liquid carbon dioxide charge occupies 46.3% of the volume of the vessel, then the carbon dioxide vapor occupies the remaining 53.7% of the volume. In this example, the average density of all carbon dioxide in the vessel can be calculated as 0.463 (47.6)+0.537 (13.3), or 29.2 lb/ft$^3$.

Since the internal volume of the vessel and the mass of carbon dioxide in the vessel remain essentially unchanged during the heating step, the average density of the captured carbon dioxide will remain essentially unchanged at 29.2 lb/ft$^3$ regardless of the temperature and pressure. In this example, heating the selected initial charge of carbon dioxide isochorically (at constant volume) at a fixed density of 29.2 lb/ft$^3$ will pass through the critical point at the critical temperature of 87.9° F. and the critical pressure of 1,071 psia. Additional heating will form a supercritical fluid at the desired temperature and pressure having a fixed density of 29.2 lb/ft$^3$. Using a smaller initial quantity of liquid carbon dioxide in the vessel will result in a lower density supercritical fluid; conversely, using a greater initial quantity of liquid carbon dioxide in the vessel will result in a higher density supercritical fluid. Heating a higher density supercritical fluid to a given temperature will generate a higher pressure than heating a lower density supercritical fluid to the same temperature.

The highest theoretically achievable pressure is obtained when the pressurization vessel initially is completely filled with liquid carbon dioxide, leaving no vapor head space in the vessel. For example, the average density of the saturated carbon dioxide liquid in the vessel at 70° F. is 47.6 lb/ft$^3$. Initial heating of the liquid carbon dioxide will change the saturated liquid into a dense fluid in a region of the phase diagram sometimes termed a compressed liquid or sub-cooled liquid. As the fluid is heated above the critical temperature of 87.9° F., it becomes a supercritical fluid by definition. In this example, the carbon dioxide may be heated at a constant density of 47.6 lb/ft$^3$ to a temperature of 189° F. to yield a supercritical fluid at a pressure of approximately 5,000 psia.

By using the method illustrated in the above examples, a dense fluid can be prepared at any selected density, temperature, and pressure. Only two of these three parameters are independent when the composition is fixed; the preferred and most convenient way to prepare a dense fluid is to select an initial charge density and composition in the pressurization vessel and then heat the charge to a desired temperature. Proper selection of the initial charge density and composition will yield the desired final pressure.

When carbon dioxide is used for a single-component dense processing fluid, the carbon dioxide may be heated to a temperature between about 100° F. and about 500° F. to generate the desired dense fluid pressure in the pressurization vessel. More generally, when using any component or components for the dense fluid, the fluid may be heated to a reduced temperature in the pressurization vessel of up to about 1.8, wherein the reduced temperature is defined as the average absolute temperature of the fluid in the pressurization vessel after heating divided by the absolute critical temperature of the fluid. The critical temperature is defined for a fluid containing any number of components as that temperature above which the fluid always exists as a single fluid phase and below which two phases may form.

Returning now to FIG. 4, valve 333 is opened and dense fluid prepared as described above passes through manifold 331 under flow control through metering valve 351. Optionally, one or more processing agents from processing agent storage vessels 353 and 355 may be introduced by pumps 357 and 359 into the dense fluid in line 361 to provide a dense processing fluid, which in a cleaning application may be described as a dense cleaning fluid. The dense processing fluid is introduced into sealable processing chamber or process tool 362 which holds one or more substrates 363 to be cleaned or processed, and valve 333 is closed. These substrates were previously placed on holder 365 in process tool 362 via a sealable entry port (not shown). The temperature in process tool 362 is controlled by means of temperature control system 367. Fluid agitator system 369 mixes the interior of process tool 362 to promote contact of the dense processing fluid with articles 363.

Processing chamber or process tool 362 is fitted with ultrasonic generator 370, which is an ultrasonic transducer array connected to high frequency power supply 371. The ultrasonic transducer may be any commercially available unit such as, for example, an ultrasonic horn from Morgan Electro Ceramics of Southampton, England. Ultrasonic generator 370 typically may be operated in a frequency range of 20 KHz to 2 MHz. In the present disclosure, the term "ultrasonic" refers to any wave or vibration having a frequency above the human audible limit of about 20 KHz.

High frequency power supply 371 typically provides power in an ultrasonic power density range of about 20 W/in$^2$ to about 40 W/in$^2$. The interior of process tool 362 typically is exposed to ultrasonic waves for 30 to 120 seconds during the cleaning step.

Ultrasonic transducers can be constructed from piezoelectric or magnetostrictive structures. Piezoelectric transducers contain crystals that oscillate at ultrasonic frequencies when alternating current is applied. Sturdier magnetostrictive transducers consist of a piece of iron or nickel surrounded by an electric coil. Such transducers are commonly built into a "probe" assembly, which includes an acoustically designed booster and a horn (not shown). Such probes can be used to maximize power transmission into the fluid, pressure vessel wall, or substrate holder.

Ultrasonic transducer array 370 may be mounted horizontally above and facing the articles being processed, as is shown in FIG. 4, such that the sonic waves are generated in a downward direction and impinge directly on articles 363. Alternatively, the transducer array may be mounted vertically on either side of the articles being cleaned (not shown) such that the ultrasonic waves are generated in a horizontal direction across the articles being cleaned.

In another alternative, the transducer array may be mounted horizontally below and in contact with holder 365 (not shown) such that the ultrasonic waves are generated in a generally vertical direction and transmitted upward through holder 365. This configuration can be used, for example, to apply the maximum ultrasonic energy to the surface of a wafer, principally when chemical reactions such as thin film deposition, etching, or electropolishing occur at the wafer surface. The wafer can be positioned in any orientation, i.e., facing up, facing down, or facing sideways. In this case, acoustic streaming carries reaction products and contaminants away from the surface. The flow sweeps in from the sides and away from the surface. Dissolved materials and suspended particles tend to migrate away from areas of sonic energy concentration, and this arrangement would tend to carry concentrated materials away from the surface and away from the ultrasonic source.

While ultrasonic transducer array ultrasonic generator 370 as shown in FIG. 4 is mounted within process tool 362, it may be mounted alternatively on the outside surface of the process tool vessel such that the generated sonic energy is transmitted through the walls of the vessel.

The initial pressure in pressurization vessel 303 and the temperature in process tool 362 may be selected so that the dense cleaning fluid in process tool 362 after the transfer step typically is a single-phase dense fluid as defined above, whether or not another processing agent is added to the original dense fluid. Alternatively, the dense processing fluid may be an emulsion or suspension containing a second suspended or dispersed phase containing the processing agent.

Sealed process tool 362 may be pressurized with the dense cleaning fluid to a typical supercritical pressure of 1,100 to 10,000 psia, or 1,500 to 7,500 psia. The tool typically operates at a supercritical temperature of up to 500° F., and may operate in a range of 100° F. to 200° F. The temperature in process tool 362 is controlled by means of temperature control system 367. Typically, the contacting of articles 363 with the dense processing fluid in process tool 362 may be effected at a reduced temperature above 1.0 and typically below about 1.8, wherein the reduced temperature is defined as the average absolute temperature of the fluid in the cleaning chamber divided by the absolute critical temperature of the fluid.

Several alternatives to the introduction of processing agent into line 361 to mix with the dense fluid prior to flowing into process tool 362 are possible. In one alternative, processing agent may be introduced directly into process tool 362 before the tool is charged with dense fluid from pressurization vessel 303. In another alternative, processing agent may be introduced directly into process tool 362 after the tool is charged with dense fluid. In yet another alternative, processing agent may be introduced directly into pressurization vessel 303 before the vessel is charged from supply vessel 301. In a further alternative, processing agent may be introduced directly into pressurization vessel 303 after the vessel is charged from supply vessel 301 but before the vessel is heated. In a final alternative, processing agent may be introduced directly into pressurization vessel 303 after the vessel is charged from supply vessel 301 and after the vessel is heated. Any of these alternatives can be accomplished using the appropriate lines, manifolds, and valves in FIG. 4.

In addition to the intense agitation provided by ultrasonic transducer 370, the interior of process tool 362 may be mixed by fluid agitator system 369 to enhance contact of the dense cleaning fluid with articles 363. Additional fluid agitation may be provided by a recirculating fluid system consisting of pump 372 and filter 373. Filter 373 serves to remove particulate contamination from the recirculating fluid, and the resulting fluid agitation mixes the dense fluid and promotes removal of contaminants or reaction products from the contaminated articles by increasing convective fluid motion.

When the cleaning cycle is complete, process tool 362 is depressurized by opening valves 375 and 377 whereby the contaminated dense fluid flows through heat exchanger 379, where it is cooled to a temperature of 70° F. to 150° F. This reduction in pressure and temperature condenses the dissolved contaminants and processing agents in the dense fluid, and the resulting fluid containing suspended contaminants and processing agents flows via line 381 into separator 383. Condensed contaminants and processing agents are removed via line 385 and the purified fluid flows via line 387 to intermediate fluid storage vessel 389. The pressure in storage vessel 389 is between the supercritical extraction pressure in process tool 362 and the pressure of carbon dioxide supply vessel 301. Typically, process tool 362 is depressurized in this step to a pressure of 900 to 1,100 psia.

During the depressurization step, valve 333 optionally may be opened so that carbon dioxide from pressurization vessel 303 also flows through cooler 379 and separator 383 with the contaminated depressurization fluid. Optionally, after process tool 362 is initially depressurized, carbon dioxide from pressurization vessel 303 may be used to partially pressurize and rinse process tool 362 to dilute and remove residual contaminants and processing agents therefrom, after which the process tool would be depressurized through cooler 379 and separator 383 to a pressure of 900 to 1,100 psia. After closing valves 375 and 377, the remaining carbon dioxide in process tool 362 then is vented through valve 391 to reduce the pressure to atmospheric. Process tool 362 optionally then may be evacuated to a subatmospheric pressure. At this point, the sealable entry port (not shown) of process tool 362 is opened, the processed articles are removed, and another group of contaminated articles is loaded for the next cleaning cycle.

Optionally, another cooler and separator (not shown) similar to cooler 379 and separator 383 may be installed in line 387. The use of this second stage of separation at an intermediate pressure allows more efficient separation of contaminants and processing agents from the carbon dioxide solvent, and may allow a degree of fractionation between the contaminants and processing agents.

Carbon dioxide in intermediate fluid storage vessel 389, typically at a pressure in the range of 900 to 1,100 psia, may be filtered by filter system 393 before being recycled via line 395 and valve 397 to liquefier 341, where it is liquefied and returned to carbon dioxide supply vessel 301 for reuse. Makeup carbon dioxide may be added as a vapor through line 398 and valve 399 or added as a liquid directly (not shown) to carbon dioxide supply vessel 301.

Alternatively, the purified carbon dioxide in line 387 or line 395 may be vented directly to the atmosphere (not shown) without recycling as described above. In this embodiment, the carbon dioxide is introduced via line 398 and valve 399 and is used in a once-through mode.

Multiple pressurization vessels may be used in the exemplary process as described above. For example, when pressurization vessel 303 of FIG. 4 is in the process of filling and heating, pressurization vessel 305 (which was previously filled and heated to provide dense fluid at the desired conditions) can supply process tool 362 via line 327, valve 335, manifold 331, and line 361. A cycle can be envisioned in which the three pressurization vessels 303, 305, and 307 operate in a staggered cycle in which one supplies dense fluid to process tool 362, another is being filled with carbon dioxide from carbon dioxide supply vessel 301, and the third is being heated after filling. Utilizing multiple pressurization vessels in this manner increases the productivity of process tool 362 and allows for backup if one of the pressurization vessels is taken off line for maintenance.

The exemplary process described above uses carbon dioxide as the dense fluid, but other dense fluid components may be used for appropriate applications. The dense fluid may comprise one or more components selected from the group consisting of carbon dioxide, nitrogen, methane, oxygen, ozone, argon, hydrogen, helium, ammonia, nitrous oxide, hydrocarbons having 2 to 6 carbon atoms, hydrogen fluoride, hydrogen chloride, sulfur trioxide, sulfur hexafluoride, nitrogen trifluoride, chlorine trifluoride, and fluorocarbons such as, but not limited to, monofluoromethane, difluoromethane, trifluoromethane, trifluoroethane, tetrafluoroethane, pentafluoroethane, perfluoropropane, pentafluoropropane, hexafluoroethane, hexafluoropropylene ($C_3F_6$), hexafluorobutadiene ($C_4F_6$), octafluorocyclobutane ($C_4F_8$), and tetrafluorochloroethane, fluoroethers, fluorinated nitrites, and fluoroamines.

The exemplary process described above with reference to FIG. 4 may utilize one or more processing agents mixed with a dense fluid to provide a dense film stripping or cleaning fluid containing 0.1 to 20 wt % processing agent. Processing agents that may be added to the dense cleaning fluid include, but are not limited to, cosolvents, surfactants, chelating agents, chemical modifiers, or other additives. Some examples of representative processing agents include acetylenic alcohols and diols, dialkyl esters (dibutyl malate, dipentyl tartrate), organosilicones, esters (ethyl acetate, ethyl lactate), ethers (diethyl ether, dipropyl ether), alcohols (methanol, isopropanol), nitriles (acetonitrile, propionitrile, benzonitrile), hydrated nitriles (ethylene cyanohydrin), glycols (ethylene glycol, propylene glycol), monoester glycols (ethylene glycol monoacetate), ketones (acetone, acetophenone) and fluorinated ketones (trifluoroacetophenone), tertiary amines including pyridines (triethyl amine, tributyl amine, 2,4, dimethylpyridine), alkanolamines (dimethylethanolamine, diethylethanolamine), amides (dimethylformamide, dimethylacetamide), carbonates (ethylene carbonate, propylene carbonate), carboxylic acids (acetic acid, tartaric acid, malic acid), alkane diols (butane diol, propane diol), alkanes (n-hexane, n-butane), peroxides (hydrogen peroxide, t-butyl hydroperoxide, 2-hydroperoxy hexafluoropropan-2-ol), water (deionized, ultrahigh purity), ureas, haloalkanes (perfluorobutane, hexafluoropentane), haloalkenes, beta-diketones such as acetylacetone, acetonyl acetone, trifluoroacetylacetone, thenoyltrifluoroacetone, or hexafluoroacetylacetone, a carboxylic acid such as citric acid, malic acid, oxalic acid, or tartaric acid, a malic acid ester and/or diester, a tartaric acid ester and/or diester, an oxine such as 8-hydroxyquinoline, a tertiary amine such as 2-acetyl pyridine, a tertiary diamine, a tertiary triamine, a nitrile such as ethylene cyanohydrin, a beta-ketoimine, ethylenediamine tetraacetic acid and its derivatives, catechol, choline-containing compounds, trifluoroacetic anhydride, an oxime such as dimethyl glyoxime, dithiocarbamates such as bis(trifluoromethyl)dithiocarbamate, terpyridine, ethylene cyanohydrin, N-(2-hydroxyethyl) iminodiacetic acid, and combinations thereof.

Dense processing fluids prepared and managed by the methods of the present invention may be used in other processing steps in the manufacture of electronic components in which material is removed from a part (etching, drying, or planarization), in which material is deposited on a part (thin film deposition), or in which material on a part is chemically modified (photoresist development).

Surface etching is a chemical reaction process, typically performed using liquid mixtures or dry plasma processes. During semiconductor substrate processing, such etching is used to reduce surface thickness, remove unwanted layers such as surface oxide, and create surface features such as trenches and via holes. Surface etching can be performed in a dense phase fluid system using ultrasonic wave enhancement.

Ultrasonic waves can be used to enhance the reaction speed of thin metal film deposition. Such films typically are deposited from metallic precursors that undergo a reduction reaction at a heated surface using a reductant such as hydrogen. The use of ultrasonic energy with a dense processing fluid increases the rate of the reaction, thereby improving process efficiency and improving the quality of the thin film.

Photoresist development is normally performed in a liquid phase system using chemicals such as tetramethyl ammonium hydroxide (TMAH) to develop exposed photoresist. This process can be performed in a dense phase fluid system according to the present invention using ultrasonic energy to enhance the surface chemical reactions which occur in photoresist development. The application of ultrasonic energy in a dense phase processing fluid can improve the diffusion of chemical reactants and reaction products near the surface of the articles being processed.

In these alternative processing steps, appropriate processing agents or reactive compounds may be added to the dense fluid to form a dense processing fluid. Some representative reactive compounds that can be added to a dense fluid as processing agents for etching or planarization processes may include, for example, hydrogen fluoride, hydrogen chloride, hexafluoroethane, nitrogen trifluoride, reactive polishing slurries (containing alumina, silica, ceria or magnesium abrasive particles suspended in an acidic, or alkaline, i.e., potassium hydroxide- or ammonia-containing mixture), and electrolytic solutions for reverse electroplating of metal surfaces. Some representative reactive and non-reactive compounds that can be added to a dense fluid for deposition processes may include, for example include organometallic precursors, photoresists, photoresist developers, interlayer dielectric materials, silane reagents and various coating materials, including but not limited to stain resistant coatings. A representative reactive compound that may be added to a dense fluid for photoresist development processeses is tetramethyl ammonium hydroxide (TMAH). Methanol is a representative compound that may be added to a dense fluid for drying processes. In these alternative uses of dense processing fluids, process tool 362 of FIG. 4 as described above for cleaning can be replaced with the appropriate process tool for these alternative applications.

The present invention combines ultrasonic energy and dense fluid immersion concurrently in the same processing tool. The semiconductor substrate or article being processed thereby is exposed to enhanced dense fluid processing comprising dissolution and/or chemical reaction combined with a simultaneous, ultrasonic energy enhancement of the process. The auxiliary mechanisms for fluid agitation described above, namely fluid agitator system 369 and recirculating fluid system consisting of pump 372 and filter 373, may also be used to enhance ultrasonic agitation. In this manner, the solvent or processing agent in a cleaning process can achieve greater penetration into relatively thick contaminant films, such as photoresist, and the inert insoluble residues are removed through the energy imposed by fluid phase oscillations. Insoluble particles may be removed through a combination of oscillatory effects and acoustic streaming (induced flow in the cleaning fluid).

The increased rate of solvent penetration into contaminant films provided by ultrasonic energy is advantageous in semiconductor substrate cleaning applications, where high throughput is necessary in order to provide an economical process. Ultrasonic agitation also tends to increase the uniformity of the cleaning process and thereby provides better cleaning or surface treatment performance than can be achieved using dense fluid immersion alone.

Ultrasonic energy causes localized pressure fluctuations in the dense fluid or dense processing fluid, which aids in cleaning or processing performance. These pulsations in pressure created by the ultrasonic waves cause corresponding oscillations in the density of the dense fluid about a mean value, which in turn causes corresponding oscillations in the solvent power of the fluid about the mean value. The solvent power therefore varies cyclically between maximum and minimum values during the process, and maximum achieved solvent power therefore exceeds the mean value that would be available without ultrasonic waves. This in turn increases the overall effectiveness of the dissolution process without a concomitant increase in the mean operating pressure. Conventional wet ultrasonic cleaning utilizes transient cavitation of liquids followed by bubble collapse, and the resulting energy release, to dislodge contaminants. Such cavitation can damage the delicate features of modern semiconductor devices. The process of the present invention preferably is operated entirely in the dense fluid region such that no phase change occurs, and therefore no cavitation can occur. Embodiments of the invention instead utilize high frequency fluid oscillations to excite adhered contaminants near their natural frequencies, thereby producing dislodgement. Since cavitation is suppressed, power dissipation is minimized, and acoustic streaming is enhanced.

A further embodiment of the invention is the use of variable frequency ultrasonic treatment in which the ultrasonic frequency is varied during the processing period. Variable frequency ultrasonic treatment eliminates static vibrational nodes on the surface of the article being processed and ensures, for example, that particles having wide-ranging natural frequencies are dislodged and suspended in the dense processing fluid. Frequencies utilized in this invention may span the range from typical ultrasonic to megasonic values (approximately 20 KHz to 2 MHz). In one embodiment, the variable frequency ultrasonic treatment may comprise starting the cleaning or processing period at a frequency in the lower end of this range and increasing the frequency gradually during the cleaning period to a final frequency in the upper end of this range. Alternatively, the variable frequency ultrasonic treatment may comprise starting the cleaning or processing period at a frequency in the higher end of this range and decreasing the frequency gradually during the period to a final frequency in the lower end of this range. In another alternative, the frequency can be raised and lowered in this range multiple times during the cleaning or processing period.

In another embodiment of the invention, ultrasonic energy is introduced intermittently into the process tool during the cleaning or processing period. In this embodiment, on-off actuation of the ultrasonic transducer provides intermittent bursts of power in the dense phase processing fluid. Such pulsing, for example, would prevent contaminants from being trapped in standing waves during a cleaning step. The frequency may be either constant or variable when the ultrasonic transducer is on, and the frequency may be either constant or variable among multiple pulse periods.

Variable frequency or intermittent ultrasonic treatment may be used with dense fluids that contain no processing agents or with dense processing fluids that by definition contain one or more processing agents. Any combination or schedule of frequency changes and/or intermittent treatment periods during the cleaning or processing step may be used with dense fluids or with dense processing fluids. The application of variable frequency and/or intermittent ultrasonic energy is particularly useful in combination with selected processing agents in dense processing fluids for the removal of various types of contaminant particles from the articles being cleaned.

The use of ultrasonic energy complements dense fluid cleaning or processing since dissolution is more effective for smaller, soluble particles while ultrasonic cleaning or processing is more effective for larger or insoluble particles. Ultrasonic cleaning or processing works well in deeply patterned surfaces, i.e., it is not topography sensitive, and the method is adaptable to automation. Ultrasonic dense fluid cleaning can provide comparable performance to wet megasonic cleaning but without the limitations of wet chemical processing. For example, either method can provide 90% removal of particles having diameters of 0.5 micrometer and larger, resulting in a surface density of less than 0.1 particle/cm$^2$.

The dense fluid or dense processing fluid used with variable frequency and/or intermittent ultrasonic treatment may be provided by the methods described earlier with reference to FIG. 4. Alternatively, the dense fluid or dense processing fluid for use with variable frequency and/or intermittent ultrasonic treatment may be prepared directly in the processing vessel by introducing a subcritical fluid into the sealable processing chamber and isolating the chamber, heating the subcritical fluid at essentially constant volume and essentially constant density to yield a dense fluid, and providing the dense processing fluid by one or more steps selected from the group consisting of (1) introducing one or more processing agents into the sealable processing chamber before introducing the subcritical fluid into the sealable processing chamber, (2) introducing one or more processing agents into the sealable processing chamber after introducing the subcritical fluid into the sealable processing chamber but before heating the subcritical fluid therein, and (3) introducing one or more processing agents into the sealable processing chamber after introducing the subcritical fluid into the sealable processing chamber and after heating the subcritical fluid therein.

Dense fluids and dense processing fluids are well-suited for ultrasonic processing. The relatively low viscosity of these fluids tends to minimize the rate of viscous dissipation of ultrasonic waves in the fluid. Therefore, the ultrasonic waves can be delivered to the surface being processed with relatively little reduction in intensity. This permits high process efficiency at minimal power consumption. Low viscous dissipation also tends to increase acoustic streaming in the dense fluid or dense processing fluid in cleaning processes, thereby promoting the removal of particulate and dissolved contaminants from the vicinity of the surface through a flushing action. This tends to bring fresh solvent into close proximity to the surface, thereby creating a higher concentration gradient for dissolved contaminants near the surface and increasing the rate of diffusion of dissolved contaminants away from the surface. The result is a reduction in the processing time required to produce a clean surface.

The relatively low viscosity of dense fluids also helps to reduce the thickness of the fluid boundary layer near the surface. The tendency toward thinner acoustic boundary layers can be seen from the following equation for acoustic boundary layer thickness, $\delta_{ac}$:

$$\delta_{ac} = \sqrt{\frac{\nu}{\pi f}}$$

where $\nu$ is the kinematic viscosity of the fluid and f is the frequency of the waves. A thinner fluid boundary layer tends to promote removal of adhered surface particles, since they are exposed to a greater average fluid velocity in a thin boundary layer than if they were shielded in a thicker, low velocity boundary layer.

In applying the present invention, semiconductor substrates may be cleaned or processed individually in order to provide direct process integration with other, single substrate processing modules. Alternatively, multiple substrates, or batches, may be cleaned or processed simultaneously in a container or "boat" placed within the cleaning or processing chamber, thereby providing high throughput and reduced cost of operation.

Ultrasonic waves improve semiconductor substrate cleaning through dense fluid immersion by providing a method for removing insoluble contaminants from surfaces using fluid oscillations and acoustic streaming and increasing the rate of penetration of solvents and co-solvents into thick film contaminant layers. As a result, the required processing time can be reduced. The thickness of the concentration boundary layer of dissolved reactants or contaminants may be decreased near the surface by acoustic streaming. This increases the diffusion rate of dissolved reactants to the surface or contaminants away from the surface, thereby reducing the required processing time. This also reduces the required density of the dense processing fluid necessary to achieve effective dissolution of soluble reactants or contaminants. This in turn reduces the required pressure of the dense processing fluid and reduces the overall cost of processing equipment necessary to achieve effective processing conditions. Also, this reduces the amount of dense fluid necessary to achieve effective processing performance and reduces the required concentrations and amounts of processing agents or reactants necessary to achieve effective processing performance in a dense processing fluid. As a result, the overall cost of ownership of the process, chemical disposal requirements, energy requirements, and environmental damage caused by the process can be reduced.

The following Examples illustrate embodiments of the present invention but do not limit the embodiments to any of the specific details described therein.

EXAMPLE 1

An embodiment of the invention according to FIG. 4 is used to treat a silicon wafer having a photoresist layer that has undergone multiple processing steps including exposure, development, etching and/or implantation with a dense processing fluid as described below.

Step 1: Pressurization vessel 303 having a volume of 2.71 liters is filled completely with 4.56 lb of saturated liquid $CO_2$ at 70° F. and 853.5 psia. The density of the initial $CO_2$ charge is 47.6 lb/ft$^3$. The vessel is sealed.

Step 2: The pressurization vessel is heated until the internal pressure reaches 5,000 psia. The density of the contained $CO_2$ remains at 47.6 lb/ft$^3$, and the temperature reaches 189° F. The contained $CO_2$ is converted to a dense fluid in the supercritical region (see FIG. 2).

Step 3: A contaminated silicon wafer is loaded into process tool 362 having an interior volume of 1 liter. The process tool is evacuated and the vessel walls and wafer are held at 104° F.

Step 4: Valve 333 connecting pressurization vessel 303 via manifold 331 and line 361 to the process tool 362 is opened, $CO_2$ flows from pressurization vessel 303 into process tool 362, and the wafer is immersed in dense phase $CO_2$. The temperature of pressurization vessel 303 remains at 189° F. The common pressure of the pressurization vessel and process module is 2,500 psia. The temperature of the process tool, 362, remains at 104° F. The dense phase $CO_2$ remains in the supercritical state in both vessels as 1.79 lb of $CO_2$ flows into 1 liter process tool 362 while the remaining 2.77 lb of $CO_2$ remains in 2.71 liter pressurization vessel 303. The density of the $CO_2$ in the cooler process tool reaches 50.6 lb/ft$^3$.

Step 5: An processing agent, propylene carbonate, is pumped from processing agent storage vessel 353 by pump 357 into process tool 362 and the process tool is isolated. The concentration of propylene carbonate in the dense fluid in the process tool is 1 wt %. The dense fluid is agitated in process tool 362 for two minutes, during which time the wafer is processed to remove contaminants. Ultrasonic transducer 370 is operated during this period at an ultrasonic frequency of 40 KHz while high frequency power supply 371 provides power at an ultrasonic power density of 40 W/in$^2$.

Step 6: Valves 333, 351, 375, 377, and 397 are opened so that fluid in process tool 362 and pressurization vessel 303 flows through cooler 379 and phase separator 383 to carbon dioxide liquefier 341 while the pressure in the system is held at 900 psia. Processing agents, reaction products, and contaminants are separated from the $CO_2$ in the separator 383. The temperature of pressurization vessel 303 remains at 189° F. during this step and the temperature of the process tool remains at 104° F. during this step. $CO_2$ is in the vapor phase in both vessels. Neglecting the relatively small effect of other mixture constituents, the density of $CO_2$ in process tool 362 is 10.32 lb/ft$^3$. 0.36 lb of $CO_2$ remains in the process tool 362.

Step 7: Pressurization vessel 303 is isolated by closing valve 333 and the vessel is cooled to 70° F., wherein the pressure falls to 632 psia, and the density of the contained $CO_2$ vapor in the vessel remains at 7.07 lb/ft$^3$.

Step 8: The remaining 0.36 lb of $CO_2$ in the process tool 362 is vented by closing valve 375 and opening valve 391, the tool is evacuated, and the clean, processed silicon wafer is removed.

The cycle is repeated by returning pressurization vessel 303 to Step 1 by refilling with liquid $CO_2$.

EXAMPLE 2

The process of Example 1 is repeated except that ultrasonic transducer system 370 is operated during the cleaning period of step (5) at a sonic frequency which begins at 20 KHz and is increased at a constant rate during the cleaning period such that the sonic frequency is 200 KHz at the end of the cleaning period.

EXAMPLE 3

The process of Example 1 is repeated except that ultrasonic transducer 370 is operated during the cleaning period of step (5) at a sonic frequency which starts at 200 KHz and is decreased at a constant rate during the cleaning period such that the sonic frequency is 20 KHz at the end of the cleaning period.

EXAMPLE 4

The process of Example 1 is repeated except that ultrasonic transducer 370 is operated intermittently by turning the transducer system on for 1 second and off for 1 second in an alternating pattern during the cleaning period of step (5). The sonic frequency is 40 KHz during the time the transducer system is on.

EXAMPLE 5

Figure 6A:
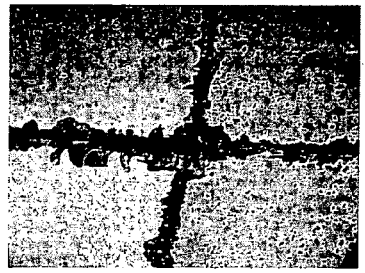
FIGS. 6a and 6b are scanning electron microscopy (SEM) images of an unpatterned silicon wafer before and after contacting the wafer with a dense processing fluid.
Figure 6B:

An un-patterned silicon wafer was scratched using a diamond stylus to create silicon debris particles on the surface. Under light microscopy, debris particles as small as approximately 0.1 micrometer could be identified on the wafer surface (see FIG. 6a). The wafer was then exposed to a dense processing fluid containing the dense fluid, supercritical $CO_2$, in a 500 ml pressurization vessel. The pressurization vessel was heated for approximately four minutes until the internal pressure reached approximately 3000 psig and a temperature of approximately 54° C. After the above pressure and temperature were reached, the wafer was exposed to 20 KHz ultrasonic waves for a period of 60 seconds during immersion in the dense processing fluid to provide impingement energy at the contaminated area. The vessel was then de-pressurized and cooled to ambient conditions. After removal from the reactor vessel, the wafer was again examined under light microscopy. The examination showed that the process removed approximately 95% of the debris particles (see FIG. 6b).

The above process was repeated with another contaminated silicon wafer under the same conditions described above, but with no exposure to ultrasonic waves, and no debris particles were removed.

EXAMPLE 6

An un-patterned silicon wafer was over-coated with a photoresist material, which was sensitive to the 193 nm wavelength of light. The over-coating was performed by spinning a selected amount of the photoresist onto a wafer, which was rotating at a known and predetermined rate. The over-coated wafer was then baked on a heated plate to a temperature of 130° C. for a period of 60 seconds to remove volatile solvents from the photoresist coating. The wafer was then fragmented into smaller samples. A surface reflectivity spectrometer manufactured by Filmetrics, Inc. of San Diego, Calif. was used to measure the resulting photoresist film thickness on the wafer samples. The photoresist film thickness was found to be approximately 400 nm on each wafer sample.

The samples were contacted with a dense cleaning fluid containing 4.5% by weight of Surfynol® 61 in a $CO_2$ dense fluid in a 500 ml reactor vessel. The samples were processed at a temperature of approximately 50° C. and a pressure of approximately 3000 psig for about 2 minutes. The temperature within the vessel was monitored and controlled using thermocouples connected to automatic power supplies for resistance heaters mounted on the vessel exterior. The pressure within the vessel was monitored using an electronic pressure gauge mounted on the vessel. $CO_2$ was supplied to the vessel using a high-pressure piston-type pump, which automatically controlled the reactor vessel pressure to the set point of 3000 psig. Surfynol® 61 was combined with the $CO_2$ stream as it flowed into the reactor vessel to form the dense cleaning fluid using a second piston-type pump. An in-line static mixer was used to ensure that the Surfynol® 61 and $CO_2$ were fully mixed before they entered the reactor vessel.

After the above pressure and temperature were reached, the wafer samples 6b and 6c (See Table III) were exposed to 20 KHz ultrasonic waves for a period of 60 seconds during immersion to provide impingement energy at the contaminated area. As a comparison, sample wafer 6a was processed under the above conditions but not exposed to the ultrasonic waves. The vessel was then flushed with $CO_2$ and then de-pressurized and cooled to ambient conditions. After removal from the reactor vessel, the wafer samples were again examined under the reflectometer and the results are provided in Table III. As Table III illustrates, the process removed more than 93% of the photoresist film when ultrasonic waves were applied to the surface whereas only 88% of the film was removed without ultrasonic waves.

TABLE III

| Example | Duration of Exposure to Ultrasonic Waves | Film Thickness After Processing (nm) | % Removal of Photoresist Film |
|---|---|---|---|
| 6a | 0 | 50 | 88% |
| 6b | 60 | <30 | >93% |
| 6c | 60 | 9.6 | 98% |

The invention claimed is:

1. A method for processing an article comprising:
  (a) introducing the article into a sealable processing chamber and sealing the processing chamber;
  (b) preparing a single-phase supercritical dense fluid by:
    (b1) cooling fluid in a separate liquefier to produce condensed subcritical fluid;
    (b2) supplying condensed subcritical fluid from the liquefier into a supply vessel;
    (b3) introducing the subcritical fluid from the supply vessel into a pressurization vessel and isolating the pressurization vessel; and
    (b4) heating the subcritical fluid at essentially constant volume and essentially constant density to yield a single-phase supercritical dense fluid;
  (c) transferring at least a portion of the single-phase supercritical dense fluid from the pressurization vessel to the processing chamber, wherein the transfer of the single-phase supercritical dense fluid is driven by the difference between the pressure in the pressurization vessel and the pressure in the processing chamber, thereby pressurizing the processing chamber with transferred dense fluid;
  (d) introducing one or more processing agents into the processing chamber either before (c), or during (c), or after (c) to provide a single-phase supercritical dense processing fluid;
  (e) introducing ultrasonic energy into the processing chamber and contacting the article with the dense processing fluid to yield a spent dense processing fluid and a treated article; and
  (f) separating the spent dense processing fluid from the treated article.

2. The method of claim 1 wherein the dense fluid is generated in (b4) at a reduced temperature in the pressurization vessel between about 1.0 to 1.8, wherein the reduced temperature is defined as the average absolute temperature of the dense fluid in the pressurization vessel after heating divided by the absolute critical temperature of the fluid.

3. The method of claim 2 wherein the contacting of the article with the dense processing fluid in the processing chamber in (d) is effected at a reduced temperature in the processing chamber between about 1.0 and about 1.8, wherein the reduced temperature is defined as the average absolute temperature of the dense processing fluid in the processing chamber during (d) divided by the absolute critical temperature of the dense processing fluid.

4. The method of claim 1 wherein the dense fluid comprises one or more components selected from the group consisting of carbon dioxide, nitrogen, methane, oxygen, ozone, argon, hydrogen, helium, ammonia, nitrous oxide, hydrogen fluoride, hydrogen chloride, sulfur trioxide, sulfur hexafluoride, nitrogen trifluoride, monofluoromethane, difluoromethane, tetrafluoromethane, trifluoromethane, trifluoroethane, tetrafluoroethane, pentafluoroethane, pert luoropropane, pentafluoropropane, hexafluoroethane, hexafluoropropylene, hexafluorobutadiene, octafluorocyclobutane, and tetrafluorochloroethane.

5. The method of claim 1 wherein the dense fluid comprises one or more hydrocarbons having 2 to 6 carbon atoms.

6. The method of claim 1 wherein the total concentration of the one or more processing agents in the dense processing fluid ranges from about 0.1 to about 20 wt %.

7. The method of claim 1 wherein the dense processing fluid comprises one or more processing agents selected from a group consisting of an acetylenic alcohol, an acetylenic diol, a dialkyl ester, hydrogen fluoride, hydrogen chloride, chlorine trifluoride, nitrogen trifluoride, hexafluoropropylene, hexafluorobutadiene, octafluorocyclobutane tetrafluorochloroethane, fluoroxytrifluoromethane ($CF_4O$), bis(difluoroxy)methane ($CF_4O_2$), cyanuric fluoride ($C_3F_3N_3$), oxalyl fluoride ($C_2F_2O_2$), nitrosyl fluoride (FNO), carbonyl fluoride ($CF_2O$), perfluoromethylamine ($CF_5N$), an ester, an ether, an alcohol, a nitrile, a hydrated nitrile, a glycol, a monester glycol, a ketone, a fluorinated ketone, a tertiary amine, an alkanolamine, an amide, a carbonate, a carboxylic acid, an alkane diol, an alkane, a peroxide, water, a urea, a haloalkane, a haloalkene, a beta-diketone, an oxine, a tertiary amine, a tertiary diamine, a tertiary triamine, a beta-ketoimine, an ethylenediamine tetraacetic acid and derivatives thereof, a catechol, a choline-containing compound, a trifluoroacetic anhydride, an oxime, a dithiocarbamate, and combinations thereof.

8. The method of claim 1 which further comprises reducing the pressure of the spent dense processing fluid to yield at least a fluid phase and a residual compound phase, and separating the phases to yield a purified fluid and recovered residual compounds.

9. The method of claim 8 which further comprises recycling the purified fluid to provide a portion of the subcritical fluid in (b3).

10. The method of claim 8 which further comprises reducing the pressure of the purified fluid to yield a further-purified fluid phase and an additional residual compound phase, and separating the phases to yield a further-purified fluid and additional recovered residual compounds.

11. The method of claim 10 which further comprises recycling the further-purified fluid to provide a portion of the subcritical fluid in (b3).

12. The method of claim 1 wherein the subcritical fluid in the pressurization vessel prior to heating in (b4) comprises a vapor phase, a liquid phase, or coexisting vapor and liquid phases.

13. A method for processing an article comprising:
   (a) introducing the article into a sealable processing chamber and sealing the processing chamber;
   (b) preparing a single-phase supercritical dense fluid by:
      (b1) cooling fluid in a separate liquefier to produce condensed subcritical fluid;
      (b2) supplying condensed subcritical fluid from the liquefier into a supply vessel;
      (b3) introducing the subcritical fluid from the supply vessel into a pressurization vessel and isolating the pressurization vessel; and
      (b4) heating the subcritical fluid at essentially constant volume and essentially constant density to yield a single-phase supercritical dense fluid;
      (b5) introducing one or more processing agents into the pressurization vessel
         before introducing the subcritical fluid into the pressurization vessel, or
         after introducing the subcritical fluid into the pressurization vessel but before heating the pressurization vessel, or
         after introducing the subcritical fluid into the pressurization vessel and after heating the pressurization vessel;
   (c) transferring at least a portion of the single-phase supercritical dense fluid from the pressurization vessel to the processing chamber, wherein the transfer of the single-phase supercritical dense fluid is driven by the difference between the pressure in the pressurization vessel and the pressure in the processing chamber, thereby pressurizing the processing chamber with transferred dense fluid;
   (d) introducing ultrasonic energy into the processing chamber and contacting the article with the transferred dense processing fluid to yield a spent dense processing fluid and a treated article; and
   (e) separating the spent dense processing fluid from the treated article.

* * * * *

UNITED STATES PATENT AND TRADEMARK OFFICE
CERTIFICATE OF CORRECTION

| | | |
|---|---|---|
| PATENT NO. | : 7,267,727 B2 | |
| APPLICATION NO. | : 10/737458 | |
| DATED | : September 11, 2007 | |
| INVENTOR(S) | : Wayne T. McDermott et al. | |

It is certified that error appears in the above-identified patent and that said Letters Patent is hereby corrected as shown below:

Column 28, Line 46

In claim 4 delete the word "pert luoropropane" and insert the word
-- perfluoropropane --

Signed and Sealed this

Sixth Day of November, 2007

JON W. DUDAS
*Director of the United States Patent and Trademark Office*